US011667059B2

United States Patent
Calafiore

(10) Patent No.: US 11,667,059 B2
(45) Date of Patent: Jun. 6, 2023

(54) TECHNIQUES FOR REDUCING SURFACE ADHESION DURING DEMOLDING IN NANOIMPRINT LITHOGRAPHY

(71) Applicant: Meta Platforms Technologies, LLC, Menlo Park, CA (US)

(72) Inventor: Giuseppe Calafiore, Redmond, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 529 days.

(21) Appl. No.: 16/745,850

(22) Filed: Jan. 17, 2020

(65) Prior Publication Data
US 2020/0247016 A1    Aug. 6, 2020

Related U.S. Application Data

(60) Provisional application No. 62/799,569, filed on Jan. 31, 2019.

(51) Int. Cl.
| B29C 33/42 | (2006.01) |
| G03F 7/00 | (2006.01) |
| B29C 33/60 | (2006.01) |
| G02B 1/10 | (2015.01) |
| C23C 16/40 | (2006.01) |
| C23C 16/34 | (2006.01) |
| C23C 14/06 | (2006.01) |
| C23C 14/08 | (2006.01) |
| C23C 16/515 | (2006.01) |

(52) U.S. Cl.
CPC ............ *B29C 33/424* (2013.01); *B29C 33/60* (2013.01); *C23C 14/0652* (2013.01); *C23C 14/08* (2013.01); *C23C 16/345* (2013.01); *C23C 16/40* (2013.01); *C23C 16/515* (2013.01); *G02B 1/10* (2013.01); *G03F 7/0002* (2013.01); *B29C 2033/426* (2013.01)

(58) Field of Classification Search
CPC ....... B29C 33/424; B29C 33/58; B29C 33/60; B29C 2033/426; G03F 7/0002
See application file for complete search history.

(56) References Cited

U.S. PATENT DOCUMENTS

| 2002/0190416 A1 * | 12/2002 | Birch | B29C 33/64 |
| | | | 106/38.22 |
| 2009/0224416 A1 * | 9/2009 | Laakkonen | G03F 7/0002 |
| | | | 264/1.38 |
| 2011/0084424 A1 * | 4/2011 | Kaida | B29C 33/424 |
| | | | 264/293 |

(Continued)

FOREIGN PATENT DOCUMENTS

CN          111505901 A      8/2020

*Primary Examiner* — Jerzi H Moreno Hernandez
(74) *Attorney, Agent, or Firm* — Weaver Austin Villeneuve & Sampson LLP

(57) ABSTRACT

Disclosed herein are techniques for molding a slanted structure. In some embodiments, a mold for nanoimprint lithography includes a support layer, a polymeric layer on the support layer and including a slanted structure, and an oxide layer on surfaces of the slanted structure. In some embodiments, the oxide layer is conformally deposited on the surfaces of the slanted structure by atomic layer deposition. In some embodiments, the mold further includes an anti-sticking layer on the oxide layer.

20 Claims, 13 Drawing Sheets

(56) References Cited

U.S. PATENT DOCUMENTS

2011/0183027 A1\* 7/2011 Miller ................... G03F 7/0002
264/219
2016/0033784 A1\* 2/2016 Levola ............... G02B 27/4205
385/37
2018/0081170 A1\* 3/2018 Kimmel ................ G03F 7/0002
2018/0299597 A1\* 10/2018 Bovero .................. B29C 33/60
2019/0227316 A1\* 7/2019 Lee ...................... G02B 5/1857

\* cited by examiner

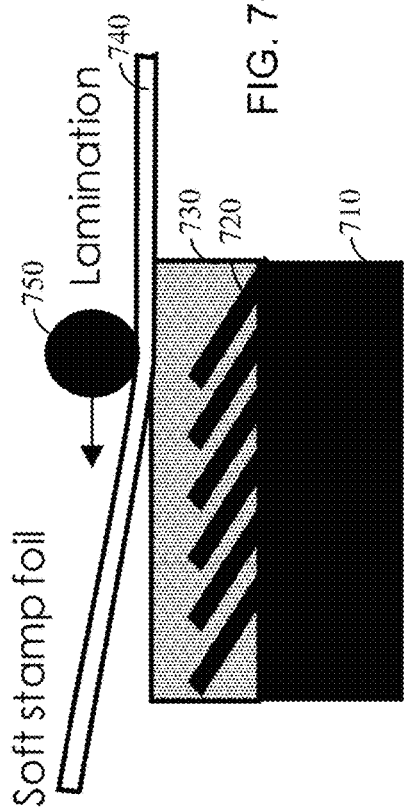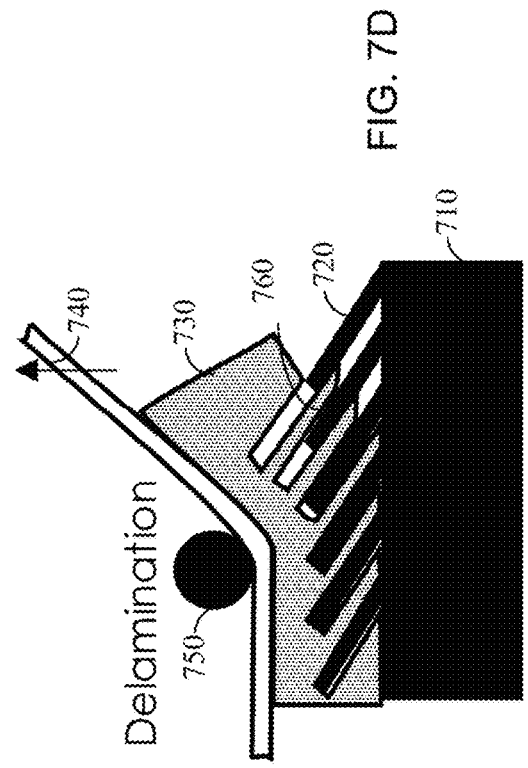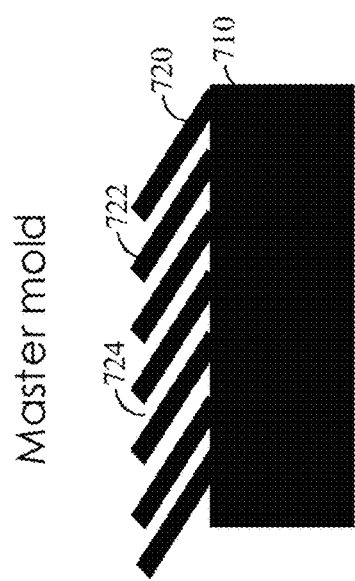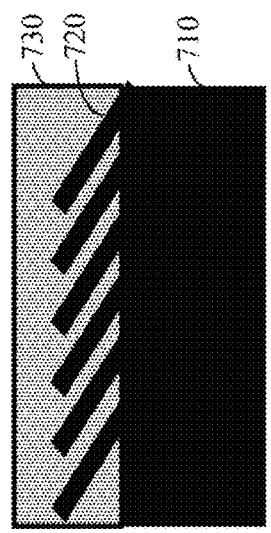

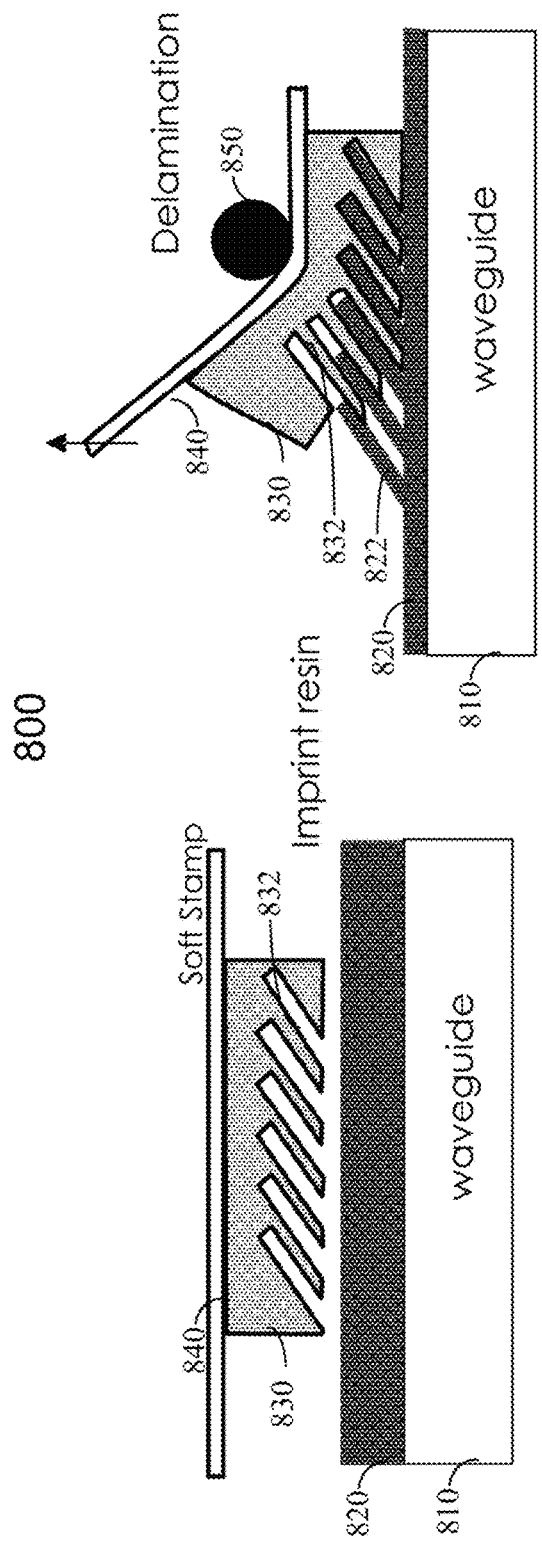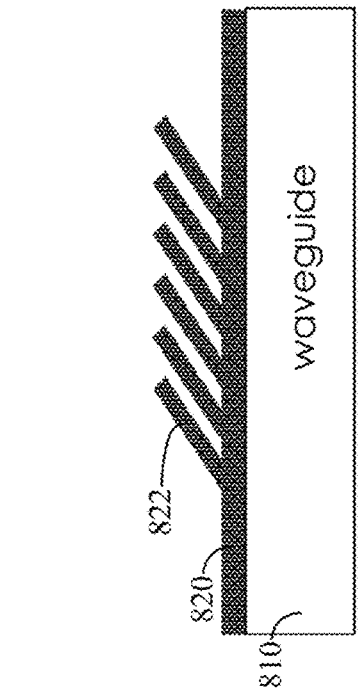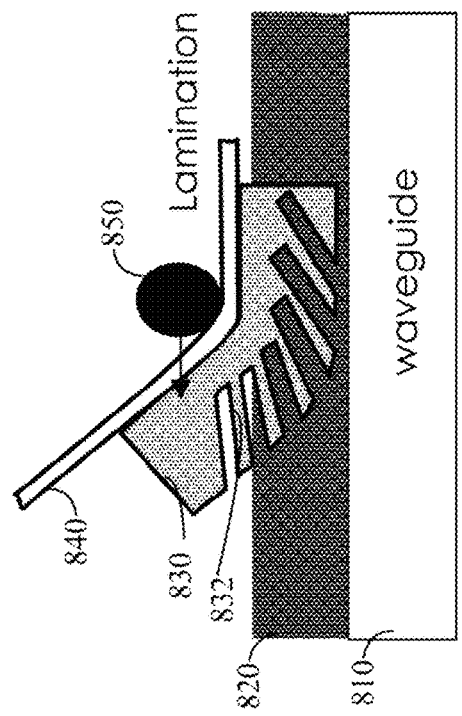

TECHNIQUES FOR REDUCING SURFACE ADHESION DURING DEMOLDING IN NANOIMPRINT LITHOGRAPHY

CROSS-REFERENCE IN NON-PROVISIONAL CONVERSION

This patent application claims benefits of and priority to U.S. Provisional Patent Application Ser. No. 62/799,569, filed Jan. 31, 2019, entitled "Techniques For Reducing Surface Adhesion During Demolding In Nanoimprint Lithography," the disclosure of which is hereby incorporated by reference in its entirety for all purposes.

BACKGROUND

An artificial reality system, such as a head-mounted display (HMD) or heads-up display (HUD) system, generally includes a near-eye display (e.g., a headset or a pair of glasses) configured to present content to a user via an electronic or optic display within, for example, about 10-20 mm in front of the user's eyes. The near-eye display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light of the projected images may be coupled into or out of the waveguide using a diffractive optical element, such as a slanted surface-relief grating. To achieve desired performance, such as high efficiency, low artifact, and angular selectivity, deep surface-relief gratings with large slanted angles and wide ranges of grating duty cycles may be used. However, fabricating the slanted surface-relief grating with the desired profile at a high fabrication speed and high yield remains a challenging task.

SUMMARY

This disclosure relates generally to waveguide-based near-eye display system. More specifically, this disclosure relates to nanoimprint lithographic (NIL) techniques for manufacturing slanted surface-relief structures, such as slanted surface-relief gratings used in a near-eye display system. According to certain embodiments, to reduce surface adhesion that may cause damages to the nano-structures on the working stamp or on the molded device during demolding, an anti-friction thin oxide layer may be coated on the working stamp. Various inventive embodiments are described herein, including devices, systems, methods, and the like.

In some embodiments, a mold for nanoimprint lithography may include a support layer, a polymeric layer on the support layer and including a slanted structure, and an oxide layer on surfaces of the slanted structure. In some embodiments, the oxide layer is characterized by a thickness less than 50 nm. In some embodiments, the oxide layer includes $SiO_2$, $Al_2O_3$, $TiO_2$, $HfO_2$, $ZrO$, $ZnO_2$, or $Si_3N_4$. In some embodiments, the oxide layer is conformally deposited on the surfaces of the slanted structure by atomic layer deposition. In some embodiments, the oxide layer is conformally deposited on the surfaces of the slanted structure by sputtering or plasma enhanced chemical vapor deposition (PECVD).

In some embodiments, the slanted structure in the mold includes a slanted ridge characterized by a slant angle greater than 45°. In some embodiments, the slanted structure includes a slanted grating characterized by a minimum duty cycle less than 30%. In some embodiments, the slanted structure includes a slanted grating characterized by a maximum duty cycle greater than 70%. In some embodiments, the slanted structure includes a slanted ridge characterized by a height greater than 100 nm.

In some embodiments, the mold further includes an anti-sticking layer on the oxide layer. In some embodiments, the anti-sticking layer includes fluorinated silane (TFS), octadecyltrichlorosilane (OTS), polybenzoxazine, or fluorodecyl-trichlorosilane (FDTS). In some embodiments, the polymeric layer includes polydimethylsiloxane (PDMS), ethylene tetrafluoroethylene (ETFE), perfluoropolyether (PFPE), or other fluorinated polymer materials.

According to certain embodiments, a method of fabricating a slanted grating may include fabricating a working stamp that includes a supporting layer and a polymeric layer including a slanted structure; depositing an oxide layer on surfaces of the slanted structure in the working stamp; and molding the slanted grating in a resin layer on a substrate using the working stamp that includes the oxide layer. In some embodiments, the method further includes depositing an anti-sticking layer on the oxide layer.

In some embodiments, the oxide layer includes $SiO_2$, $Al_2O_3$, $TiO_2$, $HfO_2$, $ZrO$, $ZnO_2$, or $Si_3N_4$. In some embodiments, the oxide layer is characterized by a thickness between 0.1 nm and 50 nm. In some embodiments, depositing the oxide layer on the surfaces of the slanted structure in the working stamp includes depositing the oxide layer conformally on the surfaces of the slanted structure using atomic layer deposition. In some embodiments, fabricating the working stamp may include molding a first stamp using a master mold, depositing a second oxide layer on surfaces of the first stamp, molding a second stamp using the first stamp, depositing a third oxide layer on surfaces of the second stamp, and molding the working stamp using the second stamp having the third oxide layer.

According to certain embodiments, a waveguide-based near-eye display may include a substrate and a polymeric layer on the substrate. The polymeric layer may include a slanted surface-relief optical grating, where a minimum duty cycle of the slanted surface-relief optical grating may be less than 30%, a slant angle of the slanted surface-relief optical grating may be greater than 45° with respect to a surface normal of the substrate, and a depth of the slanted surface-relief optical grating may be greater than 100 nm.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 6A shows a molding process. FIG. 6B shows a demolding process.

FIGS. 7A-7D illustrate an example process for fabricating a soft stamp used to make a slanted surface-relief grating according to certain embodiments. FIG. 7A shows a master mold. FIG. 7B illustrates the master mold coated with a soft stamp material layer. FIG. 7C illustrates a lamination process for laminating a soft stamp foil onto the soft stamp material layer. FIG. 7D illustrates a delamination process, where the soft stamp including the soft stamp foil and the attached soft stamp material layer is detached from the master mold.

FIGS. 8A-8D illustrate an example process for fabricating a slanted surface-relief grating using a soft stamp according to certain embodiments. FIG. 8A shows a waveguide coated with an imprint resin layer. FIG. 8B shows the lamination of the soft stamp onto the imprint resin layer. FIG. 8C shows the delamination of the soft stamp from the imprint resin layer. FIG. 8D shows an example of an imprinted slanted grating formed on the waveguide.

Figure 1:
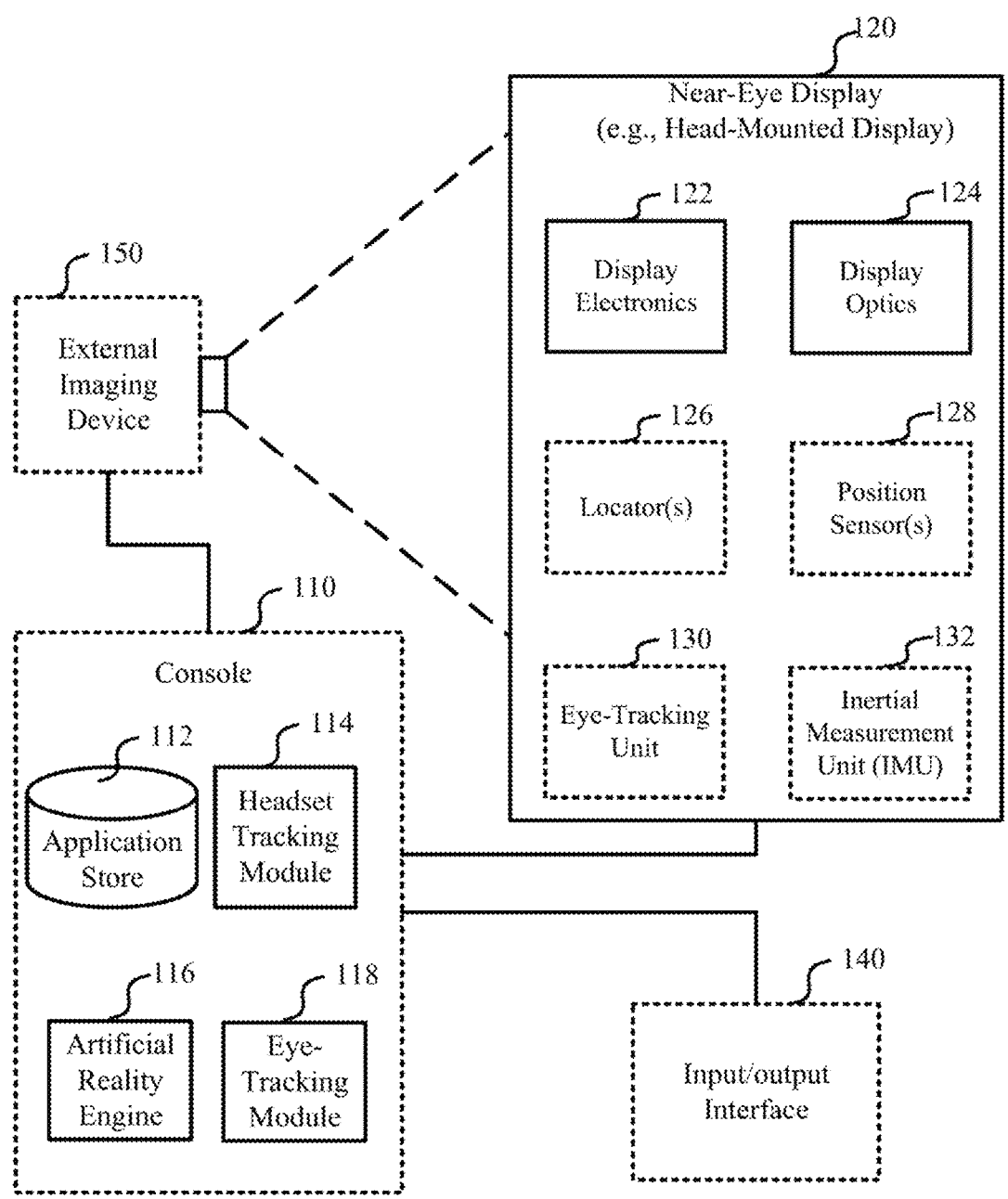
FIG. 1 is a simplified block diagram of an example artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques disclosed herein relate generally to manufacturing slanted surface-relief structures. More specifically, and without limitation, this disclosure relates to nanoimprint lithographic (NIL) techniques for fabricating deep, slanted surface-relief structures for waveguide-based displays. Techniques disclosed herein can be used to fabricate slanted surface-relief structures with large slanted angles, small critical dimensions, wide ranges of grating duty cycles, and/or high depths at a high fabrication speed and yield. The slanted structures may be used in many optical or electronic devices for manipulating behavior of light and/or electricity. For example, slanted surface-relief gratings can be used as waveguide combiner in waveguide-based displays to improve the field of view, improve the efficiency of light transfer, increase the brightness or power efficiency, and reduce display artifacts (e.g., rainbow artifacts), and/or improve other performance of the waveguide-based displays. In some embodiments, in order to achieve the desired results, a slanted surface-relief grating having a large range of grating duty cycles (e.g., from about 0.1 to about 0.9), large slant angles (e.g., greater than 30°, 45°, 60°, or larger), and high depths (e.g., greater than 100 nm) may be used.

The slanted surface-relief structures may be fabricated using many different fabrication techniques. In some implementations, the slanted surface-relief structures may be fabricated using reactive ion etching techniques or nanoimprint lithography (NIL) molding techniques. In NIL molding, a substrate may be coated with a NIL resin layer, a NIL mold (e.g., a hard mold, a soft stamp, a hard-soft stamp, or any other working stamp) with a slanted structure may be pressed against the NIL resin layer, and the NIL mold may later be detached from the NIL resin layer to form the slanted surface-relief structure in the NIL resin layer. NIL molding may significantly reduce the cost of making the slanted surface-relief structures. However, it may often be challenging to fabricate such slanted structures at a high production speed with a high fabrication accuracy and yield using either nanoimprint techniques or etching techniques. For example, it may be difficult to fabricate such deep slanted structures with a large range of duty cycles and a high aspect ratio using nanoimprint techniques without cracking or breaking at least some grating ridges of the mold, stamp, or the imprinted slanted structures.

According to certain embodiments, to reduce surface adhesion that may cause damages to the nano-structures on the working stamp or on the molded device during demolding, an anti-friction thin oxide layer may be coated on the working stamp. In one example, a working stamp for NIL may include a supporting layer, a polymeric layer including a slanted structure and attached to the supporting layer, and a thin oxide layer on surfaces of the slanted structure. The thin oxide layer may have a thickness, for example, between about 0.1 nm to about 50 nm. The thin oxide layer on the surfaces of the slanted structure in the working stamp can help to reduce the Van der Waals forces, mechanical interlock forces, and/or chemical bonding forces between the surfaces of the polymeric slanted structure in the soft stamp and the surfaces of the nano-structure in the resin layer of the manufactured device. In some embodiments, the surfaces of the oxide layer may be further treated by applying an anti-sticking layer (ASL) on the surfaces of the oxide layer. In various applications, the oxide layer and/or the ASL layer may be applied on different generations of the NIL stamps.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140 that may each be coupled to an optional console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audios may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form factor, including a pair of glasses. Some embodiments of near-eye display 120 are further described below with respect to FIGS. 2-4. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (mLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may generate slow calibration data based on calibration parameters received from console 110. Slow calibration data may include one or more images showing observed positions of locators 126 that are detectable by external imaging device 150. External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to artificial reality engine 116.

Headset tracking module 114 may calibrate the artificial reality system environment 100 using one or more calibration parameters, and may adjust one or more calibration parameters to reduce errors in determining the position of near-eye display 120. For example, headset tracking module 114 may adjust the focus of external imaging device 150 to obtain a more accurate position for observed locators on near-eye display 120. Moreover, calibration performed by headset tracking module 114 may also account for information received from IMU 132. Additionally, if tracking of near-eye display 120 is lost (e.g., external imaging device 150 loses line of sight of at least a threshold number of locators 126), headset tracking module 114 may re-calibrate some or all of the calibration parameters.

Artificial reality engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some embodiments, eye-tracking module 118 may store a mapping between images captured by eye-tracking unit 130 and eye positions to determine a reference eye position from an image captured by eye-tracking unit 130. Alternatively or additionally, eye-tracking module 118 may determine an updated eye position relative to a reference eye position by comparing an image from which the reference eye position is determined to an image from which the updated eye position is to be determined. Eye-tracking module 118 may determine eye position using measurements from different imaging devices or other sensors. For example, eye-tracking module 118 may use measurements from a slow eye-tracking system to determine a reference eye position, and then determine updated positions relative to the reference eye position from a fast eye-tracking system until a next reference eye position is determined based on measurements from the slow eye-tracking system.

Eye-tracking module 118 may also determine eye calibration parameters to improve precision and accuracy of eye tracking. Eye calibration parameters may include parameters that may change whenever a user dons or adjusts near-eye display 120. Example eye calibration parameters may include an estimated distance between a component of eye-tracking unit 130 and one or more parts of the eye, such as the eye's center, pupil, cornea boundary, or a point on the surface of the eye. Other example eye calibration parameters may be specific to a particular user and may include an estimated average eye radius, an average corneal radius, an average sclera radius, a map of features on the eye surface, and an estimated eye surface contour. In embodiments where light from the outside of near-eye display 120 may reach the eye (as in some augmented reality applications), the calibration parameters may include correction factors for intensity and color balance due to variations in light from the outside of near-eye display 120. Eye-tracking module 118 may use eye calibration parameters to determine whether the measurements captured by eye-tracking unit 130 would allow eye-tracking module 118 to determine an accurate eye position (also referred to herein as "valid measurements"). Invalid measurements, from which eye-tracking module 118 may not be able to determine an accurate eye position, may be caused by the user blinking, adjusting the headset, or removing the headset, and/or may be caused by near-eye display 120 experiencing greater than a threshold change in illumination due to external light. In some embodiments, at least some of the functions of eye-tracking module 118 may be performed by eye-tracking unit 130.

Figure 2:
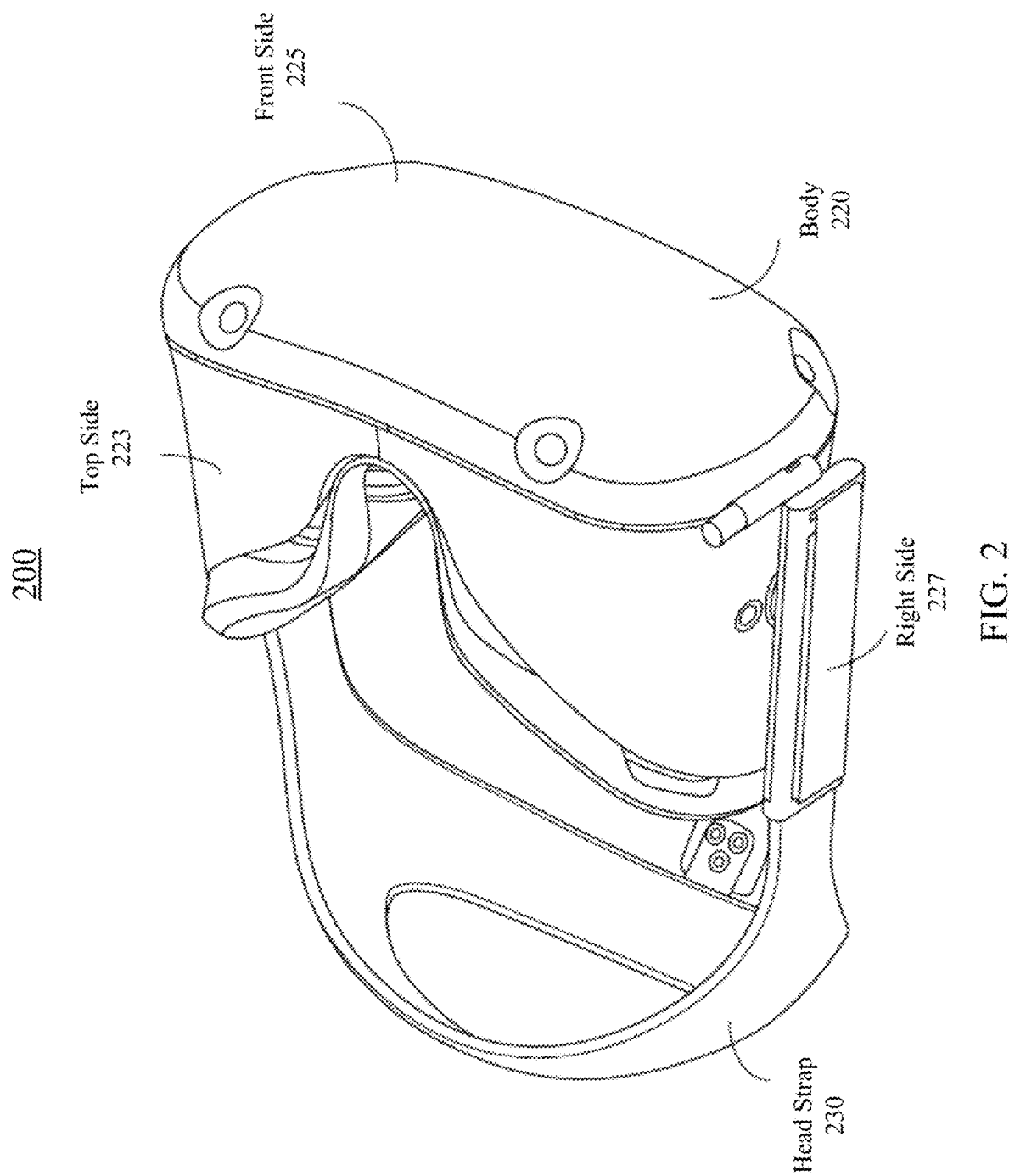
FIG. 2 is a perspective view of an example near-eye display in the form of a head-mounted display (HMD) device for implementing some of the examples disclosed herein.

FIG. 2 is a perspective view of an example of a near-eye display in the form of a head-mounted display (HMD) device 200 for implementing some of the examples disclosed herein. HMD device 200 may be a part of, e.g., a virtual reality (VR) system, an augmented reality (AR) system, a mixed reality (MR) system, or some combinations thereof. HMD device 200 may include a body 220 and a head strap 230. FIG. 2 shows a top side 223, a front side 225, and a right side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temples tips as shown in, for example, FIG. 2, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audios, or some combinations thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro light emitting diode (mLED) display, an active-matrix organic light emitting diode (AMOLED) display, a transparent organic light emitting diode (TOLED) display, some other display, or some combinations thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or some combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
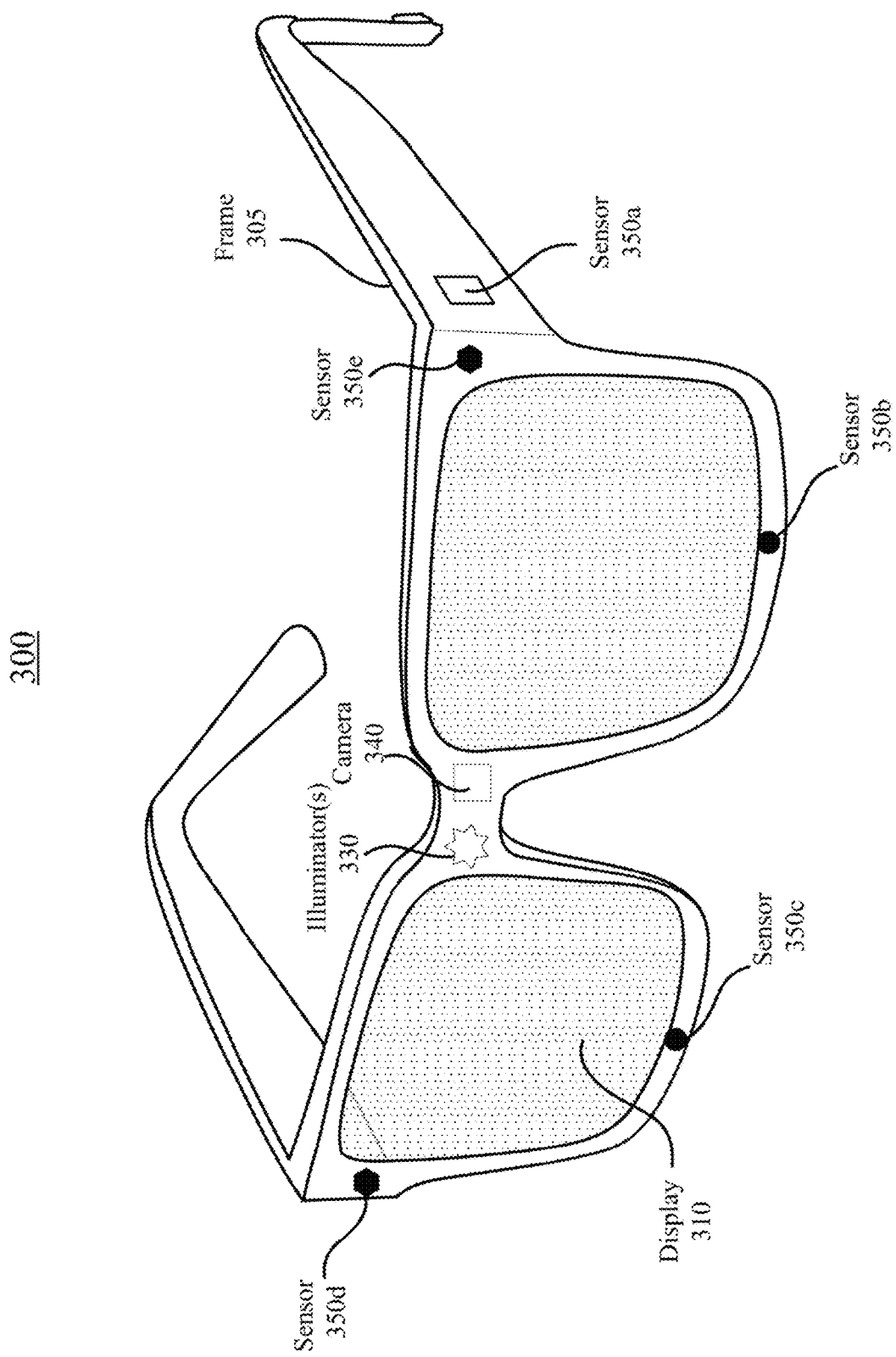
FIG. 3 is a perspective view of an example near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
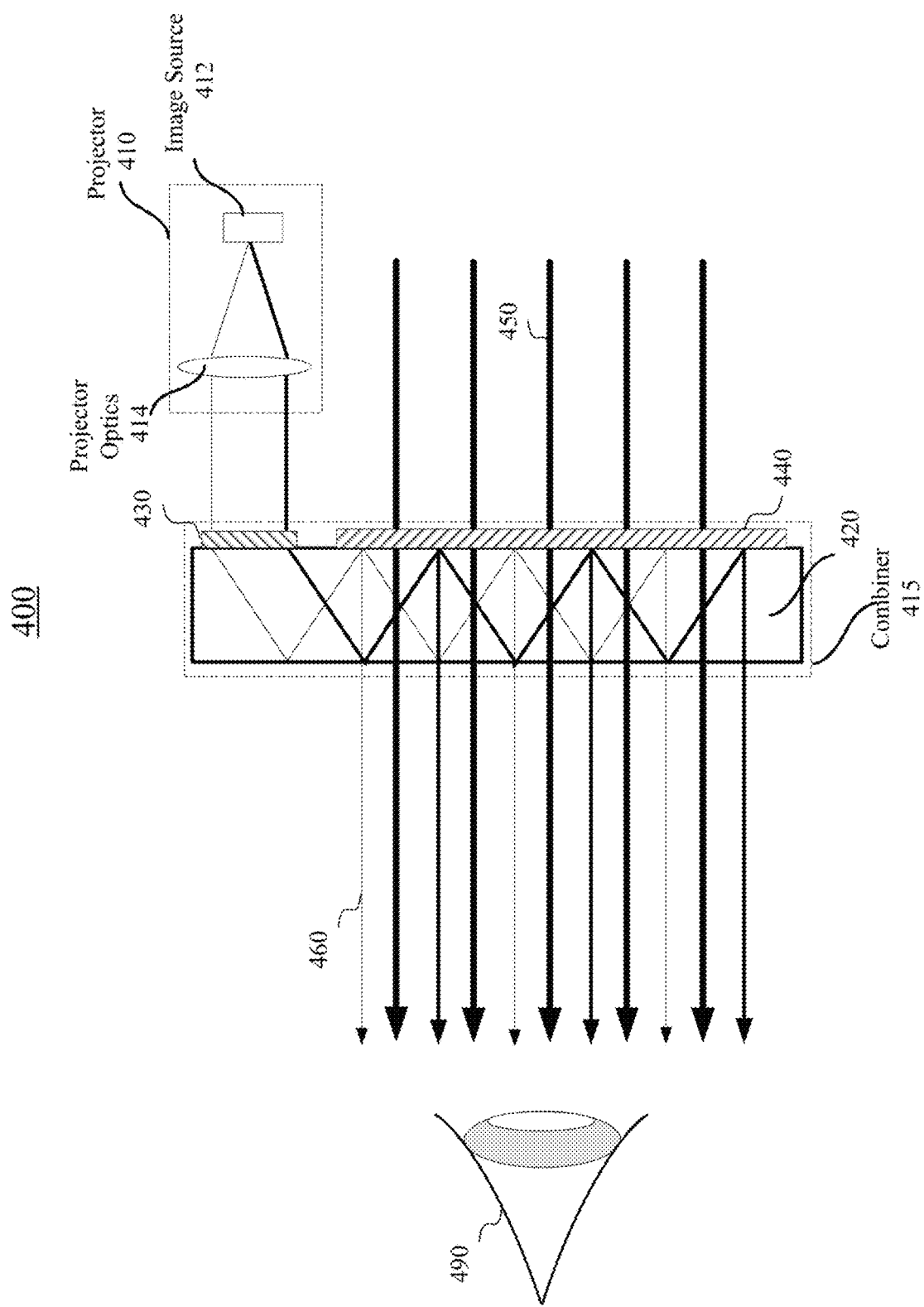
FIG. 4 illustrates an example optical see-through augmented reality system using a waveguide display according to certain embodiments.

FIG. 4 illustrates an example of an optical see-through augmented reality system 400 using a waveguide display according to certain embodiments. Augmented reality system 400 may include a projector 410 and a combiner 415. Projector 410 may include a light source or image source 412 and projector optics 414. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, and/or a light emitting diode. In some embodiments, image source 412 may include a plurality of light sources each emitting a monochromatic image light corresponding to a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Input coupler 430 may include a volume holographic grating, a diffractive optical element (DOE) (e.g., a surface-relief grating), or a refractive coupler (e.g., a wedge or a prism). Input coupler 430 may have a coupling efficiency of greater than 30%, 50%, 75%, 90%, or higher for visible light. As used herein, visible light may refer to light with a wavelength between about 380 nm to about 750 nm. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of substrate 420 may range from, for example, less than about 1 mm to about 10 mm or more. Substrate 420 may be transparent to visible light. A material may be "transparent" to a light beam if the light beam can pass through the material with a high transmission rate, such as larger than 50%, 40%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 420 may include or may be coupled to a plurality of output couplers 440 configured to extract at least a portion of the light guided by and propagating within substrate 420 from substrate 420, and direct extracted light 460 to an eye 490 of the user of augmented reality system 400. As input coupler 430, output couplers 440 may include grating couplers (e.g., volume holographic gratings or surface-relief gratings), other DOEs, prisms, etc. Output couplers 440 may have different coupling (e.g., diffraction) efficiencies at different locations. Substrate 420 may also allow light 450 from environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and virtual objects projected by projector 410.

Figure 5:
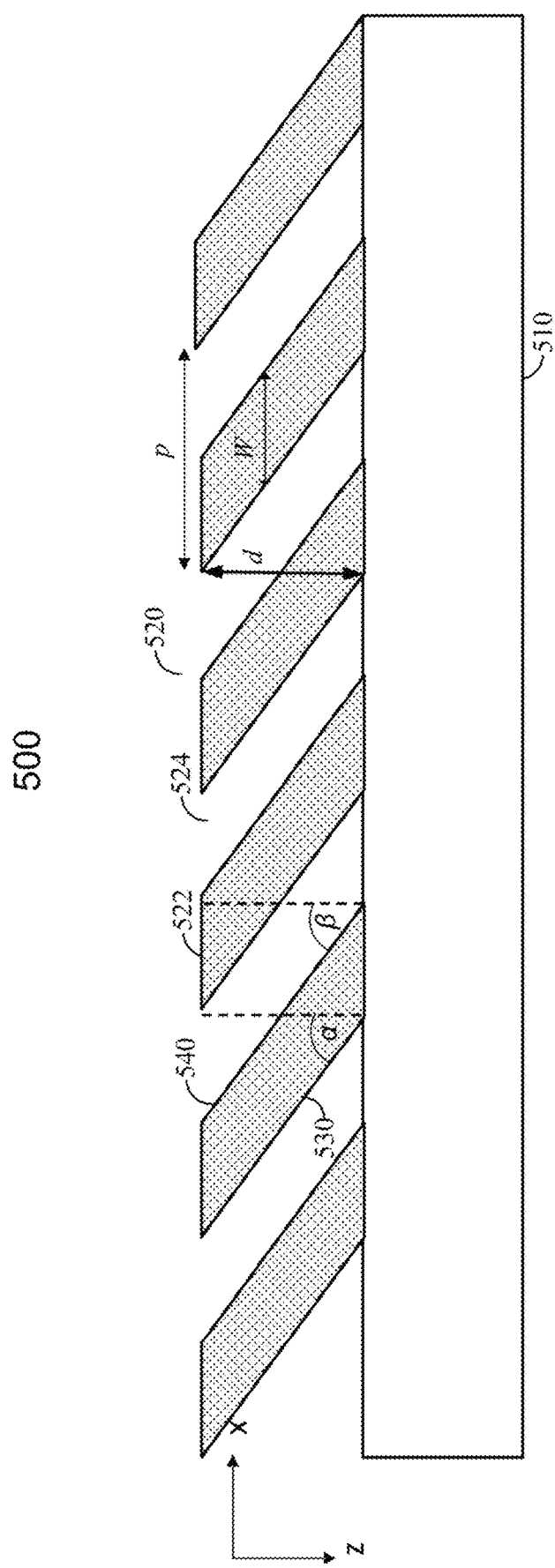
FIG. 5. illustrates an example slanted grating coupler in an example waveguide display according to certain embodiments.

FIG. 5 illustrates an example slanted grating 520 in an example waveguide display 500 according to certain embodiments. Waveguide display 500 may include slanted grating 520 on a waveguide 510, such as substrate 420. Slanted grating 520 may act as a grating coupler for coupling light into or out of waveguide 510. In some embodiments, slanted grating 520 may include a structure with a period p. For example, slanted grating 520 may include a plurality of ridges 522 and grooves 524 between ridges 522. Ridges 522 may be made of a material with a refractive index of $n_{g1}$, such as silicon containing materials (e.g., $SiO_2$, $Si_3N_4$, SiC, $SiO_xN_y$, or amorphous silicon), organic materials (e.g., polymers, spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.).

Each period of slanted grating 520 may include a ridge 522 and a groove 524, which may be an air gap or a region filled with a material with a refractive index $n_{g2}$. In some embodiments, the period p of the slanted grating may vary from one area to another on slanted grating 520, or may vary from one period to another (i.e., chirped) on slanted grating 520. The ratio between the width W of a ridge 522 and the grating period p may be referred to as the duty cycle. Slanted grating 520 may have a duty cycle ranging, for example, from about 10% to about 90% or greater. In some embodiments, the duty cycle may vary from period to period. In some embodiments, the depth d or height of ridges 522 may be greater than 50 nm, 100 nm, 200 nm, 300 nm, or higher.

Each ridge 522 may include a leading edge 530 with a slant angle α and a trailing edge 540 with a slant angle β. Slant angle α and slant angle β may be greater than 30°, 45°, 60°, or higher. In some embodiments, leading edge 530 and training edge 540 of each ridge 522 may be parallel to each other. In other words, slant angle α is approximately equal to slant angle β. In some embodiments, slant angle α may be different from slant angle β. In some embodiments, slant angle α may be approximately equal to slant angle β For example, the difference between slant angle α and slant angle β may be less than 20%, 10%, 5%, 1%, or less.

In some implementations, grooves 524 between ridges 522 may be over-coated or filled with a material having a refractive index $n_{g2}$ higher or lower than the refractive index of the material of ridges 522. For example, in some embodiments, a high refractive index material, such as Hafnia, Titania, Tantalum oxide, Tungsten oxide, Zirconium oxide, Gallium sulfide, Gallium nitride, Gallium phosphide, silicon, or a high refractive index polymer, may be used to fill grooves 524. In some embodiments, a low refractive index material, such as silicon oxide, alumina, porous silica, or fluorinated low index monomer (or polymer), may be used to fill grooves 524. As a result, the difference between the refractive index of ridges 522 and the refractive index of grooves 524 may be greater than 0.1, 0.2, 0.3, 0.5, 1.0, or higher.

The slanted grating, such as slanted grating 520 shown in FIG. 5, may be fabricated using many different nanofabrication techniques. The nanofabrication techniques generally include a patterning process and a post-patterning (e.g., over-coating) process. The patterning process may be used to form slanted ridges of the slanted grating. There may be many different nanofabrication techniques for forming the slanted ridges. For example, in some implementations, the slanted grating may be fabricated using lithographic techniques including slanted etching. In some implementations, the slanted grating may be fabricated using nanoimprint lithography (NIL) molding techniques. The post-patterning process may be used to over-coat the slanted ridges and/or to fill the gaps between the slanted ridges with a material having a different refractive index than the slanted ridges. The post-patterning process may be independent from the patterning process. Thus, a same post-patterning process may be used on slanted gratings fabricated using any pattering technique.

Techniques and processes for fabricating the slanted grating described below are for illustration purposes only and are not intended to be limiting. A person skilled in the art would understand that various modifications may be made to the techniques described below. For example, in some implementations, some operations described below may be omitted. In some implementations, additional operations may be performed to fabricate the slanted grating. Techniques disclosed herein may also be used to fabricate other slanted structures on various materials.

As described above, in some implementations, the slanted grating may be fabricated using NIL molding techniques. In NIL molding, a substrate may be coated with a NIL resin layer including, for example, a butyl-acrylate based resin doped with a resin comprising a sol-gel precursor (e.g., titanium butoxide), a monomer containing a reactive functional group for subsequent infusion processes (e.g., acrylic acid), and/or high refractive index nanoparticles (e.g., $TiO_2$, GaP, $HfO_2$, GaAs, etc.). A NIL mold (e.g., a hard stamp, a soft stamp including a polymeric material, a hard-soft stamp, or any other working stamp) with a slanted structure may be pressed against the NIL resin layer for molding a slanted surface-relief structure in the NIL resin layer. A soft stamp (e.g., made of polymers) may offer more flexibility than a hard stamp during the molding and demolding processes. The NIL resin layer may be cured subsequently using, for example, heat and/or ultraviolet (UV) light. The NIL mold may then be detached from the NIL resin layer, and a slanted structure that is complementary to the slanted structure in the NIL mold may be formed in the NIL resin layer.

In various embodiments, different generations of NIL stamps may be made and used as the working stamp to mold the slanted gratings. For example, in some embodiments, a master mold (which may be referred to as a generation 0 mold) may be fabricated (e.g., etched) in, for example, a semiconductor substrate, a quartz, or a metal plate. The master mold may be a hard stamp and may be used as the working stamp to mold the slanted grating directly, which may be referred to as hard stamp NIL or hard NIL. In such case, the slanted structure on the mold may be complimentary to the desired slanted structure of the slanted grating used as the grating coupler on a waveguide display.

In some embodiments, in order to protect the master NIL mold, the master NIL mold may be fabricated first, and a hybrid stamp (which may be referred to as generation 1 mold or stamp) may then be fabricated using the master NIL mold. The hybrid stamp may be used as the working stamp for nanoimprinting. The hybrid stamp may include a hard stamp, a soft stamp, or a hard-soft stamp. Nanoimprinting using a soft stamp may be referred to as soft stamp NIL or soft NIL. In some embodiments, the hybrid mold may include a plastic backplane with soft or hard patterned polymer (e.g., having a Young's modulus about 1 GPa). In some embodiments, the hybrid mold may include a glass backplane with soft or hard patterned polymer (e.g., having a Young's modulus about 1 GPa). In some embodiments, the hybrid mold may include a glass/plastic laminated backplane with soft or hard patterned polymer.

In some embodiments, a generation 2 hybrid mold may be made from the generation 1 mold, and may then be used as the working stamp for the nanoimprinting. In some embodiments, generation 3 hybrid molds, generation 4 hybrid molds, and the like, may be made and used as the working stamp. NIL molding may significantly reduce the cost of making the slanted surface-relief structures because the molding process may be much shorter than the etching process and no expensive reactive ion etching equipment may be needed.

Figure 6A:
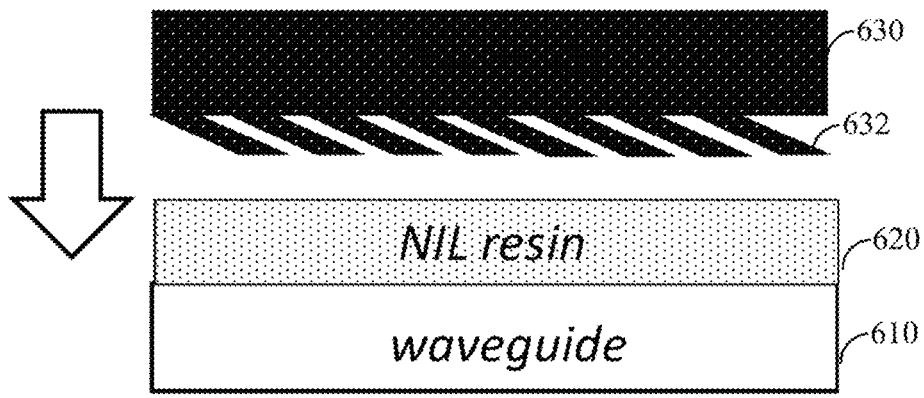
FIGS. 6A and 6B illustrate an example process for fabricating a slanted surface-relief grating by molding according to certain embodiments.
Figure 6B:
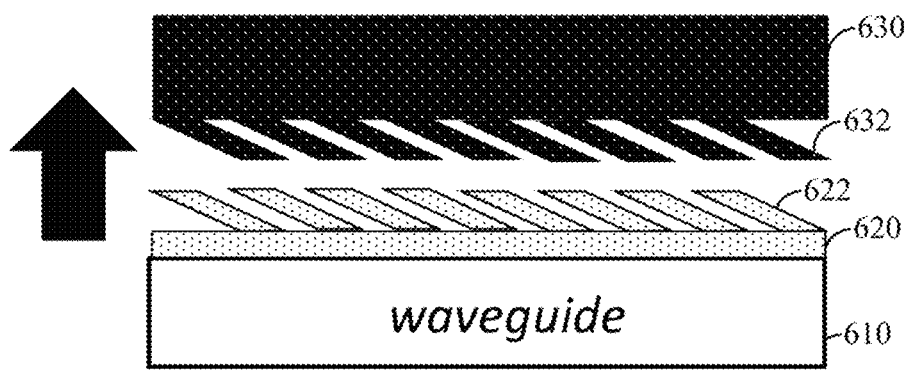

FIGS. 6A and 6B illustrate an example process for fabricating a slanted surface-relief grating by direct molding according to certain embodiments. In FIG. 6A, a waveguide 610 may be coated with a NIL resin layer 620. NIL resin layer 620 may include, for example, a butyl-acrylate-based resin doped with a sol-gel precursor (e.g., titanium butoxide), a monomer containing a reactive functional group for subsequent infusion processes (such as acrylic acid), and/or high refractive index nanoparticles (e.g., $TiO_2$, GaP, $HfO_2$, GaAs, etc.). In some embodiments, NIL resin layer 620 may include polydimethylsiloxane (PDMS) or another silicone elastomer or silicon-based organic polymer. NIL resin layer 620 may be deposited on waveguide 610 by, for example, spin-coating, lamination, or ink injection. A NIL mold 630 with slanted ridges 632 may be pressed against NIL resin layer 620 and waveguide 610 for molding a slanted grating in NIL resin layer 620. NIL resin layer 620 may be cured subsequently (e.g., cross-linked) using heat and/or ultraviolet (UV) light.

FIG. 6B shows the demolding process, during which NIL mold 630 is detached from NIL resin layer 620 and waveguide 610. As shown in FIG. 6B, after NIL mold 630 is detached from NIL resin layer 620 and waveguide 610, a slanted grating 622 that is complementary to slanted ridges 632 in NIL mold 630 may be formed in NIL resin layer 620 on waveguide 610.

In some embodiments, a master NIL mold (e.g., a hard mold including a rigid material, such as Si, $SiO_2$, $Si_3N_4$, or a metal) may be fabricated first using, for example, slanted etching, micromachining, or 3-D printing. A soft stamp may be fabricated using the master NIL mold, and the soft stamp may then be used as the working stamp to fabricate the slanted grating. In such a process, the slanted grating structure in the master NIL mold may be similar to the slanted grating of the grating coupler for the waveguide display, and the slanted grating structure on the soft stamp may be complementary to the slanted grating structure in the master NIL mold and the slanted grating of the grating coupler for the waveguide display. Compared with a hard stamp or hard mold, a soft stamp may offer more flexibility during the molding and demolding processes.

FIGS. 7A-7D illustrate an example process for fabricating a soft stamp used for making a slanted surface-relief grating according to certain embodiments. FIG. 7A shows a master mold 710 (e.g., a hard mold or hard stamp). Master mold 710 may include a rigid material, such as a semiconductor substrate (e.g., Si or GaAs), an oxide (e.g., $SiO_2$, $Si_3N_4$, $TiO_x$, $AlO_x$, $TaO_x$, or $HfO_x$), or a metal plate. Master mold 710 may be fabricated using, for example, a slanted etching process using reactive ion beams or chemically assisted reactive ion beams, a micromachining process, or a 3-D printing process. As shown in FIG. 7A, master mold 710 may include a slanted grating 720 that may in turn include a plurality of slanted ridges 722 with gaps 724 between slanted ridges 722.

FIG. 7B illustrates master mold 710 coated with a soft stamp material layer 730. Soft stamp material layer 730 may include, for example, a resin material or a curable polymer material. In some embodiments, soft stamp material layer 730 may include polydimethylsiloxane (PDMS) or another silicone elastomer or silicon-based organic polymer. In some embodiment, soft stamp material layer 730 may include ethylene tetrafluoroethylene (ETFE), perfluoropolyether (PFPE), or other fluorinated polymer materials. In some embodiments, soft stamp material layer 730 may be coated on master mold 710 by, for example, spin-coating or ink injection.

FIG. 7C illustrates a lamination process for laminating a soft stamp foil 740 onto soft stamp material layer 730. A roller 750 may be used to press soft stamp foil 740 against soft stamp material layer 730. The lamination process may also be a planarization process to make the thickness of soft stamp material layer 730 substantially uniform. After the lamination process, soft stamp foil 740 may be tightly or securely attached to soft stamp material layer 730.

FIG. 7D illustrates a delamination process, where a soft stamp including soft stamp foil 740 and attached soft stamp material layer 730 is detached from master mold 710. Soft stamp material layer 730 may include a slanted grating structure that is complementary to the slanted grating structure on master mold 710. Because the flexibility of soft stamp foil 740 and attached soft stamp material layer 730, the delamination process may be relatively easy compared with a demolding process using a hard stamp or mold. In some embodiments, a roller (e.g., roller 750) may be used in the delamination process to ensure a constant or controlled delamination speed. In some embodiments, roller 750 may not be used during the delamination. In some implementations, an anti-sticking layer may be formed on master mold 710 before soft stamp material layer 730 is coated on master mold 710. The anti-sticking layer may also facilitate the delamination process. After the delamination of the soft stamp from master mold 710, the soft stamp may be used to mold the slanted grating on a waveguide of a waveguide display.

FIGS. 8A-8D illustrate an example process for fabricating a slanted surface-relief grating using a soft stamp according to certain embodiments. FIG. 8A shows a waveguide 810 coated with an imprint resin layer 820. Imprint resin layer 820 may include, for example, a butyl-acrylate based resin doped with a sol-gel precursor (e.g., titanium butoxide), a monomer containing a reactive functional group for subsequent infusion processes (such as acrylic acid), and/or high refractive index nanoparticles (e.g., $TiO_2$, GaP, $HfO_2$, GaAs, etc.). In some embodiments, imprint resin layer 820 may include polydimethylsiloxane (PDMS) or another silicone elastomer or silicon-based organic polymer. In some embodiments, imprint resin layer 820 may include ethylene tetrafluoroethylene (ETFE), perfluoropolyether (PFPE), or other fluorinated polymer materials. Imprint resin layer 820 may be deposited on waveguide 810 by, for example, spin-coating, lamination, or ink injection. A soft stamp 830 including slanted ridges 832 attached to a soft stamp foil 840 may be used for the imprint.

FIG. 8B shows the lamination of soft stamp 830 onto imprint resin layer 820. Soft stamp 830 may be pressed against imprint resin layer 820 and waveguide 810 using a roller 850, such that slanted ridges 832 may be pressed into imprint resin layer 820. Imprint resin layer 820 may be cured subsequently. For example, imprint resin layer 820 may be cross-linked using heat and/or ultraviolet (UV) light.

FIG. 8C shows the delamination of soft stamp 830 from imprint resin layer 820. The delamination may be performed by lifting soft stamp foil 840 to detach slanted ridges 832 of soft stamp 830 from imprint resin layer 820. Imprint resin layer 820 may now include a slanted grating 822, which may be used as the grating coupler or may be over-coated to form the grating coupler for the waveguide display. As described above, because of the flexibility of soft stamp 830, the delamination process may be relatively easy compared with a demolding process using a hard stamp or mold. In some embodiments, a roller (e.g., roller 850) may be used in the delamination process to ensure a constant or controlled delamination speed. In some embodiments, roller 850 may not be used during the delamination.

FIG. 8D shows an example imprinted slanted grating 822 formed on waveguide 810 using soft stamp 830. As described above, slanted grating 822 may include ridges and gaps between the ridges and thus may be over-coated with a material having a refractive index different from imprint resin layer 820 to fill the gaps and form the grating coupler for the waveguide display.

In various embodiments, the period of the slanted grating may vary from one area to another on slanted grating 822, or may vary from one period to another (i.e., chirped) on slanted grating 822. Slanted grating 822 may have a duty cycle ranging, for example, from about 10% to about 90% or greater. In some embodiments, the duty cycle may vary from period to period. In some embodiments, the depth or height of the ridges of slanted grating 822 may be greater than 50 nm, 100 nm, 200 nm, 300 nm, or higher. The slant angles of the leading edges of the ridges of slanted grating 822 and the slant angles of the trailing edges of the ridges of slanted grating 822 may be greater than 30°, 45°, 60°, or higher. In some embodiments, the leading edge and training edge of each ridge of slanted grating 822 may be parallel to each other. In some embodiments, the difference between the slant angle of the leading edge of a ridge of slanted grating 822 and the slant angle of the trailing edge of the ridge of slanted grating 822 may be less than 20%, 10%, 5%, 1%, or less.

Figure 9:
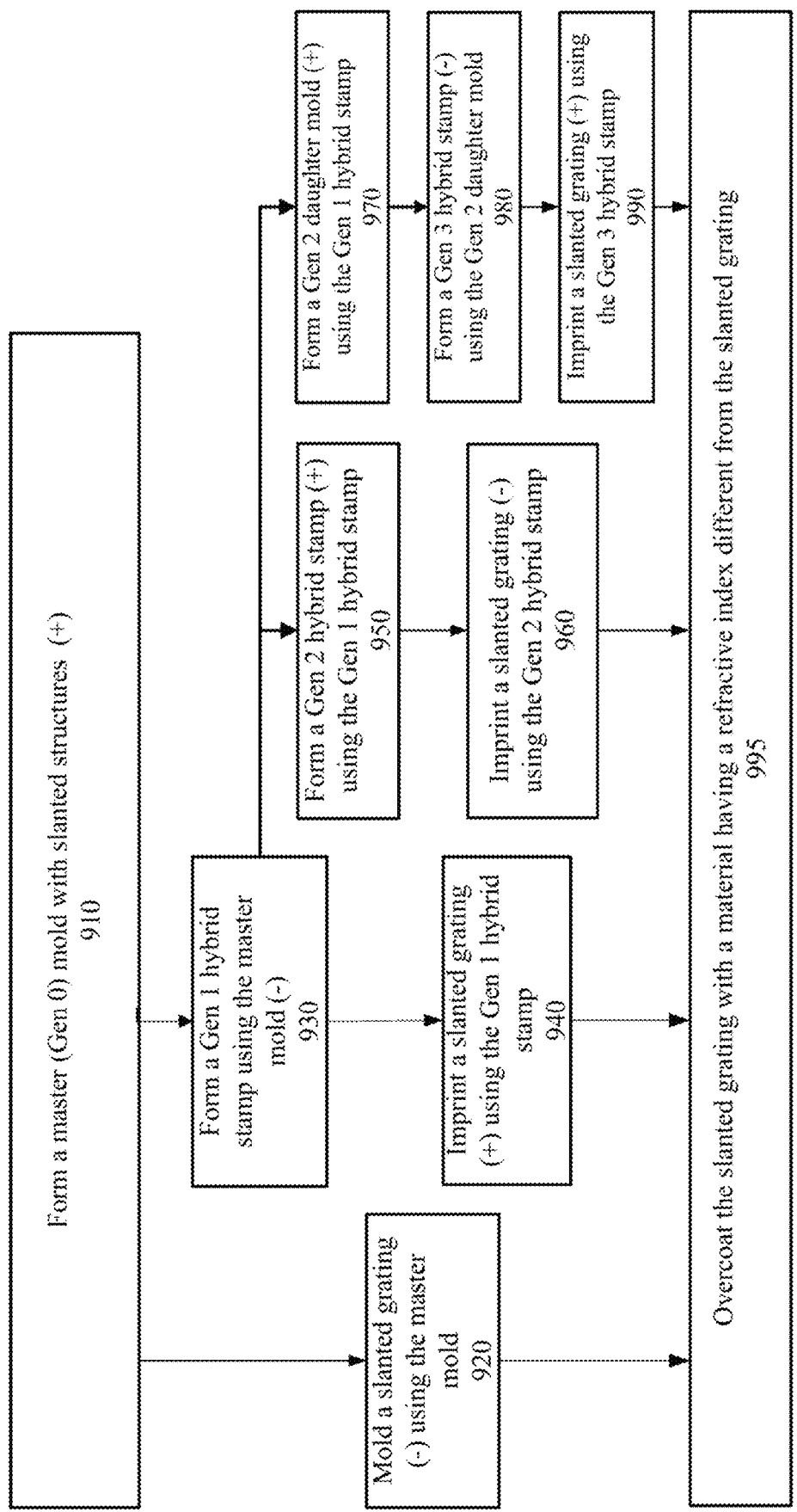
FIG. 9 is a simplified flow chart illustrating an example method of fabricating a slanted surface-relief grating using nanoimprint lithography according to certain embodiments.

FIG. 9 is a simplified flow chart 900 illustrating example methods of fabricating a slanted surface-relief grating using nanoimprint lithography according to certain embodiments. As described above, different generations of NIL stamps may be made and used as the working stamp to mold the slanted gratings. For example, in some embodiments, a master mold (i.e., generation 0 mold, which may be a hard mold) may be used as the working stamp to mold the slanted grating directly. In some embodiments, a hybrid stamp (e.g., a generation 1 hybrid mold or stamp) may be fabricated using the master mold and may be used as the working stamp for nanoimprinting. In some embodiments, a generation 2 hybrid mold (or stamp) may be made from the generation 1 mold, and may be used as the working stamp for the nanoimprinting. In some embodiments, a generation 3 mold, a generation 4 mold, and so on, may be made and used as the working stamp.

At block 910, a master mold with a slanted structure may be fabricated using, for example, a slanted etching process that uses reactive ion beams or chemically-assisted reactive ion beams, a micromachining process, or a 3-D printing process. The master mold may be referred to as the generation 0 (or Gen 0) mold. The master mold may include quartz, fused silica, silicon, other metal-oxides, or plastic compounds. The slanted structure of the master mold may be referred to as having a positive (+) tone. The master mold may be used as a working stamp for molding the slanted grating directly (i.e., hard NIL) at block 920. As described above, when the master mold is used as the working stamp, the slanted structure of the master mold may be complementary to the desired slanted grating. Alternatively, the master mold may be used to make a hybrid stamp as the working stamp for molding the slanted grating. The slanted structure of the hybrid stamp may be similar to the desired slanted grating or may be complementary to the desired slanted grating, depending on the generation of the hybrid stamp.

At block 920, a slanted grating may be molded in, for example, a resin layer using the master mold as described above with respect to, for example, FIGS. 6A and 6B. The resin layer may be coated on a waveguide substrate, and may include, for example, a butyl-acrylate based resin doped with a resin comprising a sol-gel precursor (e.g., titanium butoxide), a monomer containing a reactive functional group for subsequent infusion processes (such as acrylic acid), and/or high refractive index nanoparticles (e.g., $TiO_2$, GaP, $HfO_2$, GaAs, etc.). The master mold may be pressed against the resin layer. The resin layer may then be cured to fix the structure formed within the resin layer by the master mold. The master mold may be detached from the resin layer to form a slanted grating within the resin layer. The slanted grating within the resin layer may have a negative (−) tone compared with the slanted structure of the master mold.

Alternatively, at block 930, a hybrid stamp (e.g., a hard stamp, a soft stamp, or a hard-soft stamp) with a slanted structure may be fabricated using the master mold as described above with respect to, for example, FIGS. 7A-7D or the process described with respect to, for example, FIGS. 8A-8D. For example, the process of fabricating the hybrid stamp may include coating the master mold with a soft stamp material, such as a resin material described above. A soft stamp foil may then be laminated on the soft stamp material, for example, using a roller. The soft stamp foil and the attached soft stamp material may be securely attached to each other and may be detached from the master mold to form the soft stamp. The hybrid stamp fabricated at block 930 may be referred to as a generation 1 (or Gen 1) stamp. The slanted grating within the Gen 1 stamp may have a negative (−) tone compared with the slanted structure of the master mold.

At block 940, a slanted surface-relief grating may be imprinted using the Gen 1 stamp as described above with respect to, for example, FIGS. 8A-8D. For example, a waveguide substrate may be coated with an imprint resin layer. The Gen 1 stamp may be laminated on the imprint resin layer using, for example, a roller. After the imprint resin layer is cured, the Gen 1 stamp may be delaminated from the imprint resin layer to form a slanted grating within the imprint resin layer. The slanted grating within the imprint resin layer may have a positive tone.

Alternatively, in some embodiments, at block 950, a second generation hybrid stamp (Gen 2 stamp) may be fabricated using the Gen 1 stamp using a process similar to the process for fabricating the Gen 1 stamp as described above with respect to, for example, FIGS. 7A-8D. The slanted structure within the Gen 2 stamp may have a positive tone.

At block 960, a slanted surface-relief grating may be imprinted using the Gen 2 stamp as described above with respect to, for example, FIGS. 8A-8D. For example, a waveguide substrate may be coated with an imprint resin layer. The Gen 2 stamp may be laminated on the imprint resin layer using, for example, a roller. After the imprint resin layer is cured, the Gen 2 stamp may be delaminated from the imprint resin layer to form a slanted grating within the imprint resin layer. The slanted grating within the imprint resin layer may have a negative tone.

Alternatively, in some embodiments, at block 970, a second generation (Gen 2) daughter mold may be fabricated using the Gen 1 stamp using a process similar to the process for fabricating the Gen 1 stamp as described above with respect to, for example, FIGS. 7A-8D. The slanted structure within the Gen 2 daughter mold may have a positive tone.

At block 980, a third generation hybrid stamp (Gen 3 stamp) may be fabricated using the Gen 2 daughter mold using a process similar to the process for fabricating the Gen 1 stamp or the Gen 2 daughter mold as described above with respect to, for example, FIGS. 7A-8D. The slanted structure within the Gen 3 stamp may have a negative tone.

At block 990, a slanted surface-relief grating may be imprinted using the Gen 3 stamp as described above with respect to, for example, FIGS. 8A-8D. For example, a waveguide substrate may be coated with an imprint resin layer. The Gen 3 stamp may be laminated on the imprint resin layer using, for example, a roller. After the imprint resin layer is cured, the Gen 3 stamp may be delaminated from the imprint resin layer to form a slanted grating within the imprint resin layer. The slanted grating within the imprint resin layer may have a positive tone.

Even though not shown in FIG. 9, in some embodiments, a fourth generation hybrid stamp, a fifth generation hybrid stamp, and so on, may be fabricated using a similar process, and may be used as the working stamp for imprinting the slanted grating.

Optionally, at block 995, the slanted grating may be over-coated with a material having a refractive index different from the slanted grating (e.g., the imprint resin layer). For example, in some embodiments, a high refractive index material, such as Hafnia, Titania, Tungsten oxide, Zirconium oxide, Gallium sulfide, Gallium nitride, Gallium phosphide, silicon, or a high refractive index polymer, may be used to over-coat the slanted grating and fill the gaps between the slanted grating ridges. In some embodiments, a low refractive index material, such as silicon oxide, magnesium fluoride, porous silica, or fluorinated low index monomer (or polymer), and the like, may be used to over-coat the slanted grating and fill the gaps between the slanted grating ridges.

It may often be challenging to fabricate such slanted structures at a high production speed with a high fabrication accuracy and yield using the nanoimprint techniques. In particular, it may be difficult to fabricate such deep slanted structures with a large range of duty cycles, a small period, a high aspect ratio, or a small feature size (or critical dimension) using nanoimprint techniques without cracking or breaking at least some grating ridges of the stamp or the imprinted slanted structures. For example, when the slanted structure to be molded has a large slant angle (e.g., greater than 30°, 45°, or 60°), a high depth (e.g., >100 nm), a high aspect ratio (e.g., 3:1, 5:1, 10:1, or larger), and/or a large or small duty cycle (e.g., below 30% or greater than 70%), either the slanted structure in the stamp or the slanted structure in the imprint resin layer may experience stress during the delamination of the stamp caused by the deformation (bending) of the slanted structure and the surface adhesion or friction between the stamp and the resin layer, and the stress may be large enough to cause damages in the slanted structure, such as breaking some ridges in the stamp or the imprint resin layer. In many circumstances, it may be difficult to reduce or eliminate the stress caused by surface adhesion or friction between the stamp (e.g., the polymeric slanted structure in the soft stamp) and the imprint resin layer. The surface friction or adhesion may be caused by, for example, Van der Waals forces, mechanical interlock forces, and chemical bonding forces.

Figure 10A:
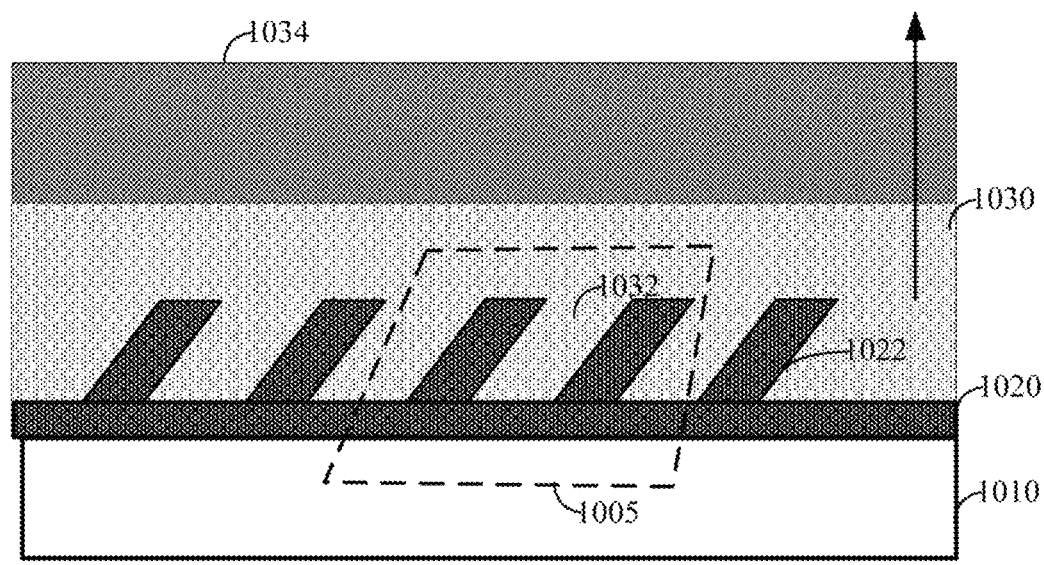
FIG. 10A illustrates an example of a demolding process in nanoimprint lithography according to certain embodiments.

FIG. 10A illustrates an example of a demolding process in nanoimprint lithography according to certain embodiments. As illustrated, a waveguide 1010 is coated with an imprint resin layer 1020. Imprint resin layer 1020 may include a viscous liquid material, such as a sol-gel or other mixtures that may be deformed and hardened. A working stamp 1030 that includes a plurality of slanted ridges 1032 in a polymeric layer and a backplane 1034 (e.g., a soft stamp foil) may have been pressed against imprint resin layer 1020 to form a plurality of slanted ridges 1022 in imprint resin layer 1020. Imprint resin layer 1020 may have also been hardened by, for example, UV curing or thermal treatment.

During the demolding or delamination shown in FIG. 10A, working stamp 1030 may be pulled up gradually to separate working stamp 1030 from imprint resin layer 1020. During the demolding, because of the slanted structures (rather than vertical structures) of the slanted ridges, at least one of working stamp 1030 (including slanted ridges 1032) or slanted ridges 1022 in imprint resin layer 1020 may be bended or otherwise deformed due to the force between slanted ridges 1032 and slanted ridges 1022, such as normal forces applied on slanted ridges 1032 or slanted ridges 1022. In addition, slanted ridges 1032 and slanted ridges 1022 may also be stressed (e.g., pulled) by tension force caused by tangential force (e.g., friction) at the interfaces between slanted ridges 1032 and slanted ridges 1022.

Thus, if slanted ridges 1032 or slanted ridges 1022 cannot withstand the stress (e.g., shear stress and tension stress) caused by the interactions between slanted ridges 1032 and slanted ridges 1022, some slanted ridges 1032 or slanted ridges 1022 may break. For example, if the duty cycle of the grating to fabricated is small, the width of some slanted ridges 1022 may be small, and thus slanted ridges 1022 may be more susceptible to being damaged. On the other hand, if the duty cycle of the grating to fabricated is large, the width of some slanted ridges 1032 may be small, and thus slanted ridges 1032 may be more susceptible to being damaged. In some embodiments where the grating period is small, slanted ridges 1032 or slanted ridges 1022 may be damaged even if the duty cycle is about 50% because the width of the slanted ridges may be small. In some embodiments where the depth or height (and thus the aspect ratio) of slanted ridges 1022 or 1032 is high, slanted ridges 1032 or slanted ridges 1022 may also be susceptible to damage due to the large tension force applied on the slanted ridges caused by the friction or the tension force to overcome the friction. A zoom-in view of a region 1005 in FIG. 10A is shown below to illustrate the interactions between slanted ridges 1032 and slanted ridges 1022 during demolding.

Figure 10B:
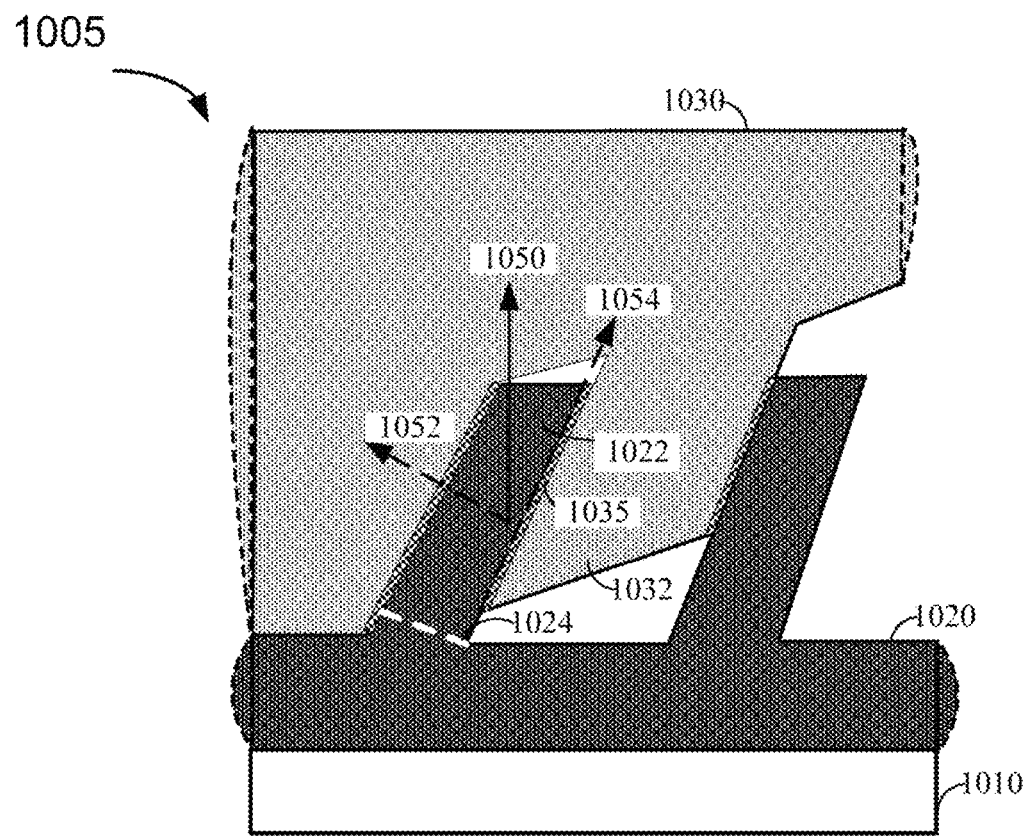
FIG. 10B illustrates examples of stresses experienced by a grating ridge during a demolding process in nanoimprint lithography according to certain embodiments.

FIG. 10B illustrates examples of stresses experienced by a grating ridge during a demolding process in nanoimprint lithography according to certain embodiments. FIG. 10B may be a zoom-in view of region 1005 in FIG. 10A. As shown in FIG. 10B, when working stamp 1030 is lifted up, working stamp 1030 may apply a force 1050 on slanted ridge 1022 at an interface 1035 between slanted ridge 1022 and slanted ridge 1032. Force 1050 may include a normal force 1052 and a tangential force 1054. Normal force 1052 may cause slanted ridge 1022 to bend in a counter-clockwise direction, which may cause a shear stress at the bottom 1024 of slanted ridge 1022. Tangential force 1054 may be caused by the friction or adhesion force at interface 1035 when separating slanted ridge 1032 from slanted ridge 1022, and may cause tension stress on slanted ridge 1022. In some embodiments, normal force 1052 may be reduced by, for example, changing the pulling direction, such as pulling in a direction along interface 1035.

Tangential force 1054 (e.g., surface friction or adhesion force) may be caused by many mechanisms. For example, tangential force 1054 may be partially caused the van der Waals forces between the atoms or molecules at interface 1035. Tangential force 1054 may also be at least partially caused by the mechanical interlock forces due to the uneven surfaces at interface 1035. For example, due to the structures of the large molecules in the polymeric or resin materials, the surfaces at interface 1035 may be rough in a microscopic view. Thus, molecules in slanted ridge 1032 may mechanically interlock with molecules in slanted ridge 1022. In addition, because the structures and chemical elements (e.g., carbon and hydrogen) of the molecules in slanted ridge 1032 and the molecules in slanted ridge 1022 may be similar, chemical bonds may be formed between chemical elements in the polymeric slanted structures in the soft stamp and the imprint resin layer. Thus, to move slanted ridge 1032 relative to slanted ridge 1022, chemical bonding forces may need to be overcome. Because many different mechanisms may cause the tangential force 1054 (or surface friction or adhesion), tangential force 1054 may not be easily reduced or eliminated by changing the way (e.g., the direction) working stamp 1030 is pulled.

According to certain embodiments, to reduce surface adhesion or friction that may cause damages to the nanostructures on any stamp (including stamps of different generations as described above with respect to FIG. 9, such as the working stamp) or the molded device during demolding, an anti-friction (e.g., thin oxide) layer may be coated on the stamp. As such, a stamp for making a next generation stamp or a working stamp for imprinting a slanted structure using nanoimprint lithographic techniques may include a supporting layer (e.g., a backplane), a polymeric layer formed on the supporting layer and including a slanted structure, and a thin oxide layer on surfaces of the slanted structure. The supporting layer may include, for example, a glass layer, a flexible soft stamp foil or membrane (which may also be referred to as carrier foil), such as a polyethylene terephthalate (PET) sheet. The polymeric layer may include, for example, various PDMS-based materials, ethylene tetrafluoroethylene (ETFE), perfluoropolyether (PFPE), or other fluorinated polymer materials. In some embodiments, the polymeric layer may include a buffer layer and a patterned layer that includes the slanted structure. The buffer layer and the patterned layer may include a same material or different materials. The thin oxide layer on the surfaces of the slanted structure can help to reduce the Van der Waals forces, mechanical interlock forces, and chemical bonding forces between the polymeric slanted structures in the soft stamp and the imprint resin layer.

In various embodiments, the thin oxide layer may include, for example, silicon oxide, aluminum oxide, titanium oxide, $HfO_2$, $ZrO_2$, $ZnO_2$, silicon nitride, and the like. The thin oxide layer may have a thickness between about 0.1 nm and about 50 nm. In some embodiments, the thin oxide layer may be conformally formed on the surfaces of the slanted structure in the soft stamp using an atomic layer deposition (ALD) technique. In some embodiments, the thin oxide layer may be formed on the surfaces of the slanted structure in the soft stamp by sputtering, plasma enhanced chemical vapor deposition (PECVD), or other chemical vapor deposition (CVD) techniques.

Figure 11A:
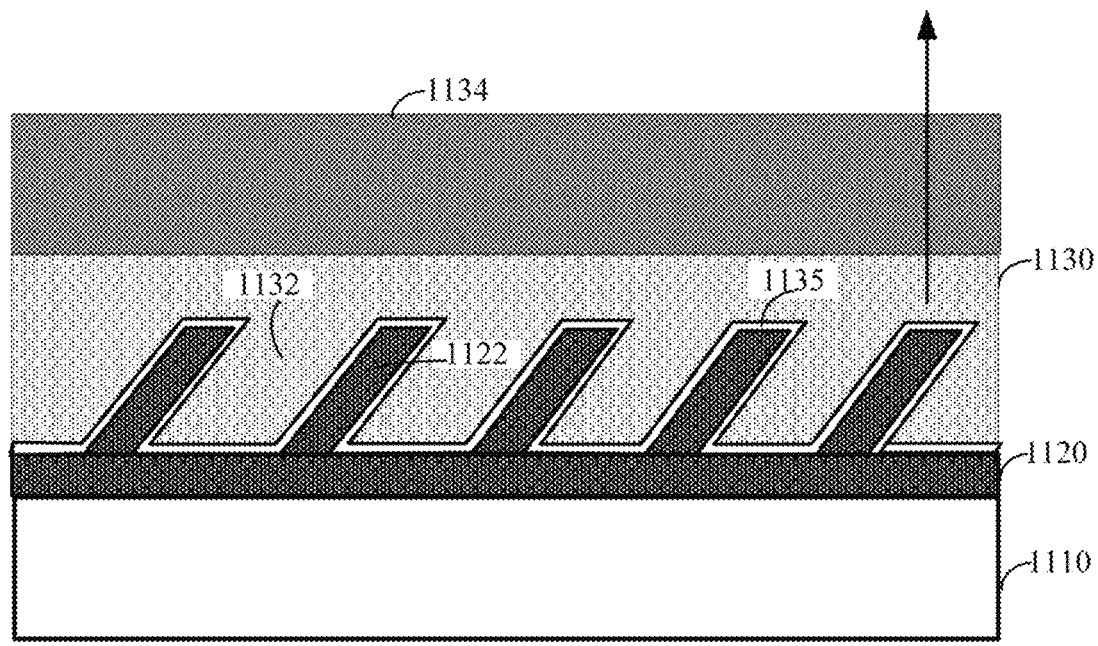
FIG. 11A illustrates an example of a demolding process with reduced surface adhesion in nanoimprint lithography according to certain embodiments.

FIG. 11A illustrates an example of a demolding process with reduced surface adhesion in nanoimprint lithography according to certain embodiments. As illustrated, a substrate 1110 is coated with an imprint resin layer 1120. Imprint resin layer 1120 may be similar to imprint resin layer 1020 described above. A working stamp, such as a soft stamp 1130 that includes a plurality of slanted ridges 1132 in a polymeric layer, a thin oxide layer 1135 on surfaces of slanted ridges 1132, and a soft stamp foil 1134, may have been pressed against imprint resin layer 1120 to form a plurality of slanted ridges 1122 in imprint resin layer 1120. Thin oxide layer 1135 may be an anti-friction layer that includes, for example, silicon oxide, aluminum oxide, titanium oxide, $HfO_2$, $ZrO_2$, $ZnO_2$, silicon nitride, and the like. Imprint resin layer 1120 may have also been hardened by, for example, UV curing or thermal treatment. During the demolding or delamination shown in FIG. 11, soft stamp 1130 may be pulled up gradually to separate soft stamp 1130 from imprint resin layer 1120.

As described above, thin oxide layer 1135 can be formed on the surfaces of soft stamp 1130 in an ALD process. In the ALD process, soft stamp 1130 may be exposed to, for example, two reactants, in a sequential, non-overlapping way. The ALD process can be used to uniformly deposit low refractive index materials (e.g., $Al_2O_3$ or $SiO_2$) or high refractive index materials (e.g., ZnS, $HfO_2$, or $TiO_2$) on a surface. For example, the atomic layer deposition of silicon dioxide ($SiO_2$) may be performed using a variety of silicon precursors and oxidants, such as $H_2O$, oxygen plasma, or $O_3$. Each reactant may react with the surface in a self-limited way where the reactant molecules may react only with a finite number of reactive sites on the surface. Once all the reactive sites have been consumed, the reaction (or deposition) may stop, and the remaining reactant molecules may be flushed away. A second reactant may only be injected into the reactor after the first reactant has been flushed away, and may only react with the first reactant at the finite number of reactive sites on the surface.

Because the reactants are injected into the reactor at different times and excess reactants are purged before a different reactant is injected, the reaction does not take place in the gas phase, and is only surface limited. As such, ALD can offer a high reproducibility, large-area thickness uniformity, and conformal coating on structured substrates with a high aspect ratio. The surface-controlled ALD growth mechanism enables an excellent scalability of film thickness within a sub-nanometer range or nanometer range as well as high repeatability. Using atomic layer deposition, the thickness of the resultant thin layer can be precisely controlled by the number of ALD cycles. For example, thin oxide layer 1135 may be deposited in one or more cycles, and may have a thickness between about 0.1 nm and about 50 nm.

In some embodiments, the stamp may be made to include a slanted structure with duty cycles slightly lower than the desired duty cycles. When the thin oxide layer is deposited uniformly on the surface of the slanted structure in the stamp, the duty cycles of the slanted structure in the stamp may be increased to the desired values.

Figure 11B:
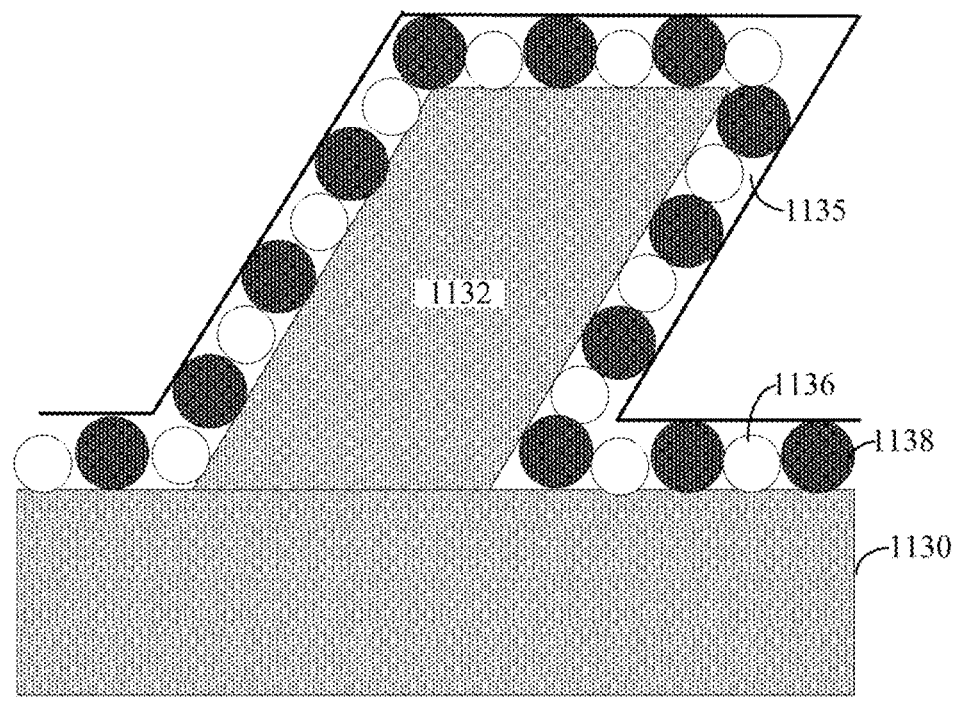
FIG. 11B is an illustrative drawing showing a slanted ridge of an example soft stamp according to certain embodiments.

FIG. 11B is an illustrative drawing showing a slanted ridge 1132 of an example of soft stamp 1130 according to certain embodiments. In the example shown in FIG. 11B, thin oxide layer 1135 may include a single layer of $SiO_2$ deposited on the surface of slanted ridge 1132. Silicon atoms 1138 and oxygen atoms 1136 may form Si—O bonds at the surface of slanted ridge 1132. Thin oxide layer 1135 may separate the polymeric molecules in slanted ridges 1132 and the polymeric molecules in slanted ridges 1122, thus reducing the Van der Waals forces and chemical bonding forces between the molecules in slanted ridges 1132 and slanted ridges 1122. In addition, because a uniform layer of $SiO_2$ is formed on the surfaces of slanted ridges 1132 and the atoms of silicon and oxygen are small, the outer surfaces of thin oxide layer 1135 may be a smooth surface, and thus the mechanical interlock forces between slanted ridges 1132 and slanted ridges 1122 may be reduced as well. For example, in some embodiments, the thickness of thin oxide layer 1135 may vary less than about 10%, 5%, 2%, 1%, or lower of the average thickness of thin oxide layer 1135. In some embodiments, the depth of any dip or the height of any protrusion at the outer surfaces of thin oxide layer 1135 may be less than about 5 nm, less than about 4 nm, less than about 2 nm, less than about 1 nm, less than about 0.5 nm, less than about 0.1 nm, or lower.

As such, when soft stamp 1130 is pulled away from imprint resin layer 1120 and substrate 1110, the tangential force at the surfaces between slanted ridges 1132 and slanted ridges 1122 may be much lower than tangential force 1054 shown in FIG. 10B. Thus, the tension stress on slanted ridges 1122 may be reduced. Similarly, the tension stress on slanted ridges 1132 may be reduced as well.

In some embodiments, the surfaces of the oxide layer may be further treated by applying an anti-sticking layer (ASL) on the surfaces of the oxide layer. In some embodiments, the ASL may include a fluorinated material, such as fluorinated silane (TFS). In some embodiments, the ASL may include, for example, a Teflon-like anti-adhesion layer, octadecyltrichlorosilane (OTS), polybenzoxazine, fluorodecyltrichlorosilane (FDTS), and the like. The application of the ASL layer may include gas phase or liquid phase application.

In various embodiments, the oxide layer and/or the ASL layer may be applied on different generations of the stamps as described above with respect to FIG. 9. For example, from a generation 0 stamp (e.g., a quartz stamp), a generation 1 stamp (e.g., a hybrid stamp) may be made and used as the working stamp. An oxide layer and/or an ASL layer may be formed on surfaces of the generation 1 stamp. In some embodiments, from the generation 1 stamp, a generation 2 stamp (or daughter mold) may be made. An oxide layer and/or an ASL layer may be formed on surfaces of the generation 2 stamp. In some embodiments, from the generation 2 stamp, a generation 3 stamp may be made and used as the working stamp, and so on. The oxide layer and/or the ASL layer described above may be applied to the stamp of any generation, including generation 0, 1, 2, 3, or 4 stamp, and the like.

Figure 12:
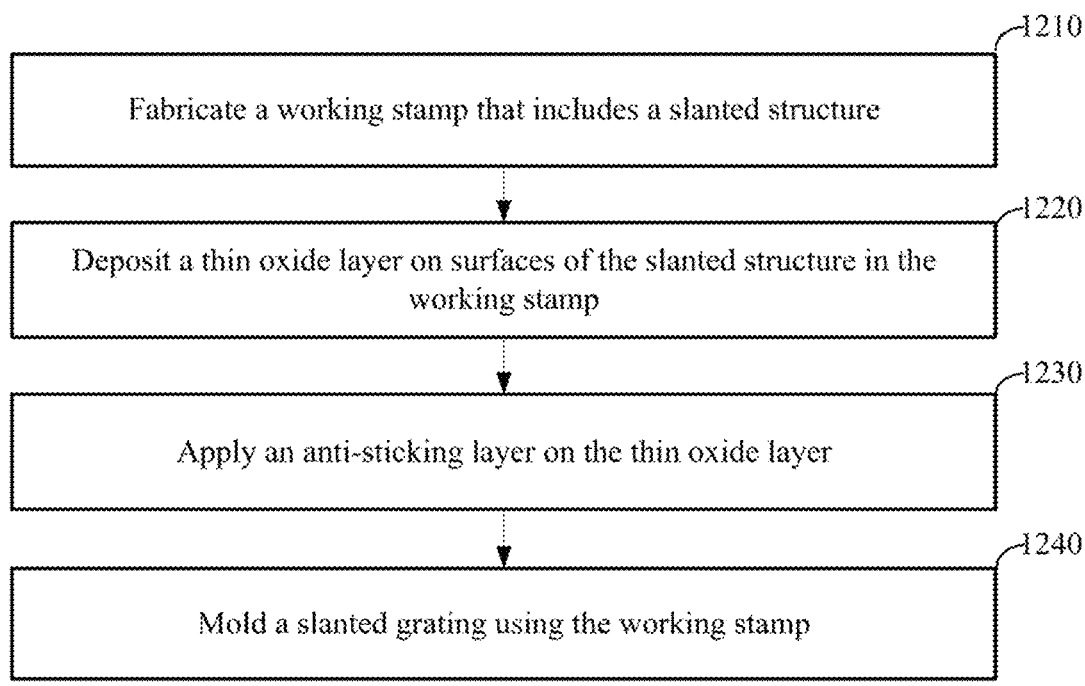
FIG. 12 illustrates an example method of fabricating a slanted surface-relief grating using nanoimprint lithography according to certain embodiments.

FIG. 12 illustrates an example of a method of fabricating a slanted surface-relief grating using nanoimprint lithography according to certain embodiments. The operations described in flow chart 1200 are for illustration purposes only and are not intended to be limiting. In various implementations, modifications may be made to flow chart 1200 to add additional operations or to omit some operations.

At block 1210, a working stamp may be fabricated. For example, the working stamp may be molded using the process described above with respect to FIGS. 7A-7D. The working stamp may include a support layer, such as a foil or membrane (e.g., a PET sheet or a glass plate). The working stamp may also include a polymeric layer in which a slanted structure may be formed. The slanted structure may include a slanted grating. In some embodiments, the period of the slanted grating may vary from one area to another in the slanted grating, or may vary from one period to another (i.e., chirped) in the slanted grating. The slanted grating may have a duty cycle ranging, for example, from about 10% to about 90% or greater. In some embodiments, the duty cycle may vary from period to period. In some embodiments, the depth or height of the ridges of the slanted grating may be greater than 50 nm, 100 nm, 200 nm, 300 nm, or higher. The slant angle of the leading edges of the ridges of the slanted grating and the slant angle of the trailing edges of the ridges of the slanted grating may be greater than 30°, 45°, 60°, or higher. In some embodiments, the leading edge and training edge of each ridge of the slanted grating may be parallel to each other. In some embodiments, the difference between the slant angle of the leading edge of a ridge of the slanted grating and the slant angle of the trailing edge of the ridge of the slanted grating may be less than 20%, 10%, 5%, 1%, or less. The polymeric layer may include, for example, various PDMS-based materials, ethylene tetrafluoroethylene (ETFE), perfluoropolyether (PFPE), or other fluorinated polymer materials. In some embodiments, the polymeric layer may include a buffer layer and a patterned layer where the slanted structure is formed. The buffer layer may be between the flexible support layer and the patterned layer, and may include a same material or different materials as the patterned layer.

As described above with respect to FIG. 9, in some embodiments, the working stamp may be a Gen 1 hybrid stamp molded using a master mold (i.e., Gen 0 stamp). As also described above, the master mold may be made using, for example, a slanted etching process using reactive ion beams or chemically assisted reactive ion beams, a micro-machining process, or a 3-D printing process. The master mold may include a substrate that may include a rigid material, such as a semiconductor substrate (e.g., Si or GaAs), an oxide (e.g., $SiO_2$, $Si_3N_4$, $TiO_x$, $AlO_x$, $TaO_x$, or $HfO_x$), or a metal plate. In some embodiments, the working stamp may be a Gen 2 hybrid stamp molded using a Gen 1 stamp. In some embodiments, the working stamp may be a Gen 3 hybrid stamp molded using a Gen 2 stamp, and so on.

At block 1220, a thin oxide layer may be deposited on surfaces of the slanted structure in the working stamp. In some embodiments, the thin oxide layer may have a thickness between about 0.1 nm and about 50 nm. In some embodiments, the thin oxide layer may include $SiO_2$, $Al_2O_3$, $TiO_2$, $HfO_2$, $ZrO$, $ZnO_2$, $Si_3N_4$, or the like. In some embodiments, the thin oxide layer may be conformally deposited on the surfaces of the slanted structure by atomic layer deposition, or by sputtering or plasma enhanced chemical vapor deposition (PECVD). In some embodiments, the thickness of the thin oxide layer may vary less than about 10%, 5%, 2%, 1%, or lower of the average thickness of the thin oxide layer. In some embodiments, the depth of any dip or the height of any protrusion at the outer surfaces of the thin oxide layer may be less than about 5 nm, less than about 4 nm, less than about 2 nm, less than about 1 nm, less than about 0.5 nm, less than about 0.1 nm, or lower.

Optionally, at block 1230, an anti-sticking layer (ASL) may be applied on the thin oxide layer. In some embodiments, the ASL may include a fluorinated material, such as fluorinated silane (TFS). In some embodiments, the ASL may include, for example, a Teflon-like anti-adhesion layer, octadecyltrichlorosilane (OTS), polybenzoxazine, fluorodecyl-trichlorosilane (FDTS), or the like. The application of the ASL layer may include, for example, gas phase or liquid phase application. The working stamp may be used for molding slanted structures (e.g., gratings) for waveguide-based near-eye displays.

At block 1240, a slanted grating may be molded using the working stamp having the thin oxide layer and/or the ASL as described above with respect to FIGS. 8A-8D, FIG. 9, and FIG. 11. As described above, the slanted grating may be molded in a resin or polymeric layer on a substrate, such as a waveguide in a near-eye display. The resin layer may include a viscous liquid material, such as a sol-gel or other mixtures that may be deformed and hardened. In some embodiments, the resin layer may include, for example, a butyl-acrylate based resin doped with a sol-gel precursor (e.g., titanium butoxide), a monomer including a reactive functional group for subsequent infusion processes (such as acrylic acid), and/or high refractive index nanoparticles (e.g., $TiO_2$, GaP, $HfO_2$, GaAs, etc.). In some embodiments, the resin layer may include polydimethylsiloxane (PDMS) or another silicone elastomer or silicon-based organic polymer. In some embodiments, the resin layer may include ethylene tetrafluoroethylene (ETFE), perfluoropolyether (PFPE), or other fluorinated polymer materials.

In some embodiments, the slanted grating molded at block 1240 may be over-coated with a material having a refractive index different from the slanted grating (e.g., the imprint resin layer). For example, in some embodiments, a high refractive index material, such as Hafnia, Titania, Tungsten oxide, Zirconium oxide, Gallium sulfide, Gallium nitride, Gallium phosphide, silicon, or a high refractive index polymer, may be used to over-coat the slanted grating and fill the gaps between the slanted grating ridges. In some embodiments, a low refractive index material, such as silicon oxide, magnesium fluoride, porous silica, or fluorinated low index monomer (or polymer), and the like, may be used to over-coat the slanted grating and fill the gaps between the slanted grating ridges.

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 13:
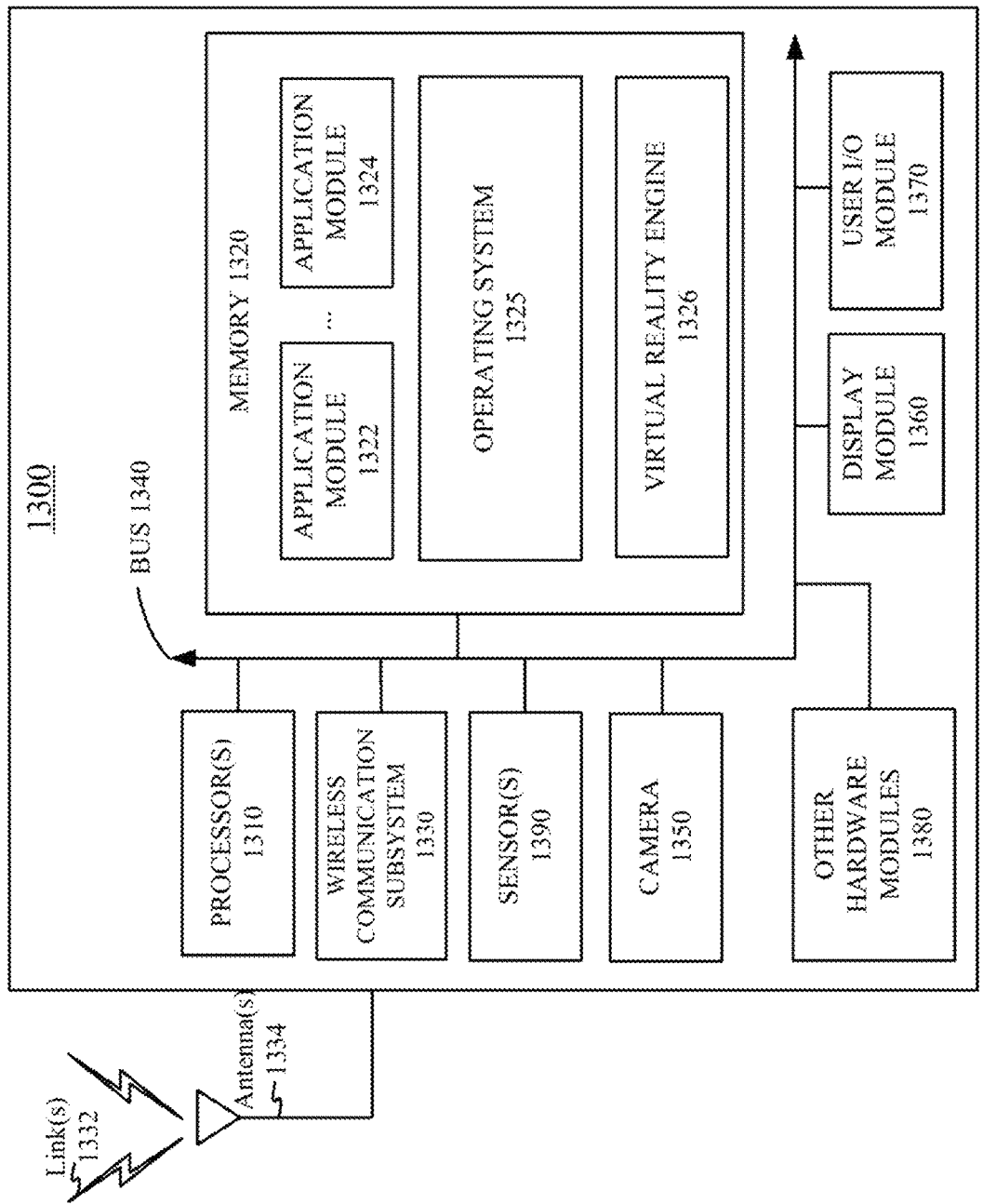
FIG. 13 is a simplified block diagram of an example electronic system of an example near-eye display according to certain embodiments.

FIG. 13 is a simplified block diagram of an example electronic system 1300 of an example near-eye display (e.g., HMD device) for implementing some of the examples disclosed herein. Electronic system 1300 may be used as the electronic system of an HMD device or other near-eye displays described above. In this example, electronic system 1300 may include one or more processor(s) 1310 and a memory 1320. Processor(s) 1310 may be configured to execute instructions for performing operations at a number of components, and can be, for example, a general-purpose processor or microprocessor suitable for implementation within a portable electronic device. Processor(s) 1310 may be communicatively coupled with a plurality of components within electronic system 1300. To realize this communicative coupling, processor(s) 1310 may communicate with the other illustrated components across a bus 1340. Bus 1340 may be any subsystem adapted to transfer data within electronic system 1300. Bus 1340 may include a plurality of computer buses and additional circuitry to transfer data.

Memory 1320 may be coupled to processor(s) 1310. In some embodiments, memory 1320 may offer both short-term and long-term storage and may be divided into several units. Memory 1320 may be volatile, such as static random access memory (SRAM) and/or dynamic random access memory (DRAM) and/or non-volatile, such as read-only memory (ROM), flash memory, and the like. Furthermore, memory 1320 may include removable storage devices, such as secure digital (SD) cards. Memory 1320 may provide storage of computer-readable instructions, data structures, program modules, and other data for electronic system 1300. In some embodiments, memory 1320 may be distributed into different hardware modules. A set of instructions and/or code might be stored on memory 1320. The instructions might take the form of executable code that may be executable by electronic system 1300, and/or might take the form of source and/or installable code, which, upon compilation and/or installation on electronic system 1300 (e.g., using any of a variety of generally available compilers, installation programs, compression/decompression utilities, etc.), may take the form of executable code.

In some embodiments, memory 1320 may store a plurality of application modules 1322 through 1324, which may include any number of applications. Examples of applications may include gaming applications, conferencing applications, video playback applications, or other suitable applications. The applications may include a depth sensing function or eye tracking function. Application modules 1322-1524 may include particular instructions to be executed by processor(s) 1310. In some embodiments, certain applications or parts of application modules 1322-1524 may be executable by other hardware modules 1380. In certain embodiments, memory 1320 may additionally include secure memory, which may include additional security controls to prevent copying or other unauthorized access to secure information.

In some embodiments, memory 1320 may include an operating system 1325 loaded therein. Operating system 1325 may be operable to initiate the execution of the instructions provided by application modules 1322-1524 and/or manage other hardware modules 1380 as well as interfaces with a wireless communication subsystem 1330 which may include one or more wireless transceivers. Operating system 1325 may be adapted to perform other operations across the components of electronic system 1300 including threading, resource management, data storage control and other similar functionality.

Wireless communication subsystem 1330 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1300 may include one or more antennas 1334 for wireless communication as part of wireless communication subsystem 1330 or as a separate component coupled to any portion of the system. Depending on desired functionality, wireless communication subsystem 1330 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1330 may permit data to be exchanged with a network, other computer systems, and/or any other devices described herein. Wireless communication subsystem 1330 may include a means for transmitting or receiving data, such as identifiers of HMD devices, position data, a geographic map, a heat map, photos, or videos, using antenna(s) 1334 and wireless link(s) 1332. Wireless communication subsystem 1330, processor(s) 1310, and memory 1320 may together comprise at least a part of one or more of a means for performing some functions disclosed herein.

Embodiments of electronic system 1300 may also include one or more sensors 1390. Sensor(s) 1390 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1390 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1300 may include a display module 1360. Display module 1360 may be a near-eye display, and may graphically present information, such as images, videos, and various instructions, from electronic system 1300 to a user. Such information may be derived from one or more application modules 1322-1524, virtual reality engine 1326, one or more other hardware modules 1380, a combination thereof, or any other suitable means for resolving graphical content for the user (e.g., by operating system 1325). Display module 1360 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1300 may include a user input/output module 1370. User input/output module 1370 may allow a user to send action requests to electronic system 1300. An action request may be a request to perform a particular action. For example, an action request may be to start or end an application or to perform a particular action within the application. User input/output module 1370 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1300. In some embodiments, user input/output module 1370 may provide haptic feedback to the user in accordance with instructions received from electronic system 1300. For example, the haptic feedback may be provided when an action request is received or has been performed.

Electronic system 1300 may include a camera 1350 that may be used to take photos or videos of a user, for example, for tracking the user's eye position. Camera 1350 may also be used to take photos or videos of the environment, for example, for VR, AR, or MR applications. Camera 1350 may include, for example, a complementary metal-oxide-semiconductor (CMOS) image sensor with a few millions or tens of millions of pixels. In some implementations, camera 1350 may include two or more cameras that may be used to capture 3-D images.

In some embodiments, electronic system 1300 may include a plurality of other hardware modules 1380. Each of other hardware modules 1380 may be a physical module within electronic system 1300. While each of other hardware modules 1380 may be permanently configured as a structure, some of other hardware modules 1380 may be temporarily configured to perform specific functions or temporarily activated. Examples of other hardware modules 1380 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1380 may be implemented in software.

In some embodiments, memory 1320 of electronic system 1300 may also store a virtual reality engine 1326. Virtual reality engine 1326 may execute applications within electronic system 1300 and receive position information, acceleration information, velocity information, predicted future positions, or some combination thereof of the HMD device from the various sensors. In some embodiments, the information received by virtual reality engine 1326 may be used for producing a signal (e.g., display instructions) to display module 1360. For example, if the received information indicates that the user has looked to the left, virtual reality engine 1326 may generate content for the HMD device that mirrors the user's movement in a virtual environment. Additionally, virtual reality engine 1326 may perform an action within an application in response to an action request received from user input/output module 1370 and provide feedback to the user. The provided feedback may be visual, audible, or haptic feedback. In some implementations, processor(s) 1310 may include one or more GPUs that may execute virtual reality engine 1326.

In various implementations, the above-described hardware and modules may be implemented on a single device or on multiple devices that can communicate with one another using wired or wireless connections. For example, in some implementations, some components or modules, such as GPUs, virtual reality engine 1326, and applications (e.g., tracking application), may be implemented on a console separate from the head-mounted display device. In some implementations, one console may be connected to or support more than one HMD.

In alternative configurations, different and/or additional components may be included in electronic system 1300. Similarly, functionality of one or more of the components can be distributed among the components in a manner different from the manner described above. For example, in some embodiments, electronic system 1300 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A mold for nanoimprint lithography, the mold including:
   a support layer;
   a polymeric layer on the support layer, the polymeric layer including a slanted structure having a plurality of slanted ridges, wherein a leading edge and a trailing edge of each slanted ridge of the plurality of slanted ridges are slanted in a similar direction with respect to a surface normal direction of the support layer; and
   an oxide layer conformally deposited on surfaces of the slanted structure, wherein the oxide layer includes a metal or semiconductor element that is not in the polymeric layer.

2. The mold of claim 1, wherein the oxide layer is characterized by a thickness less than 50 nm.

3. The mold of claim 1, wherein the oxide layer is characterized by a thickness greater than 0.1 nm.

4. The mold of claim 1, wherein the oxide layer includes $SiO_2$, $Al_2O_3$, $TiO_2$, $HfO_2$, $ZrO$, $ZnO_2$, or $Si_3N_4$.

5. The mold of claim 1, wherein the slanted structure includes a slanted ridge characterized by a slant angle greater than 45°.

6. The mold of claim 1, wherein the slanted structure includes a slanted grating characterized by a minimum duty cycle less than 30%.

7. The mold of claim 1, wherein the slanted structure includes a slanted grating characterized by a maximum duty cycle greater than 70%.

8. The mold of claim 1, wherein the slanted structure includes a slanted ridge characterized by a height greater than 100 nm.

9. The mold of claim 1, wherein the oxide layer is conformally deposited on the surfaces of the slanted structure by atomic layer deposition.

10. The mold of claim 1, wherein the oxide layer is conformally deposited on the surfaces of the slanted structure by sputtering or plasma enhanced chemical vapor deposition (PECVD).

11. The mold of claim 1, wherein the polymeric layer includes polydimethylsiloxane (PDMS), ethylene tetrafluoroethylene (ETFE), perfluoropolyether (PFPE), or other fluorinated polymer materials.

12. The mold of claim 1, further comprising an anti-sticking layer on the oxide layer.

13. The mold of claim 12, wherein the anti-sticking layer includes fluorinated silane (TFS), octadecyltrichlorosilane (OTS), polybenzoxazine, or fluorodecyl-trichlorosilane (FDTS).

14. The mold of claim 1, wherein the oxide layer is characterized by a thickness variation less than 0.5 nm or less than 5% of an average thickness of the oxide layer.

15. The mold of claim 1, wherein the oxide layer is characterized by a thickness less than 1 nm.

16. A method of fabricating a slanted grating, the method comprising:
fabricating a working stamp, the working stamp comprising a supporting layer and a polymeric layer including a slanted structure having a plurality of slanted ridges, wherein a leading edge and a trailing edge of each slanted ridge of the plurality of slanted ridges are slanted in a similar direction with respect to a surface normal direction of the support layer;
conformally depositing an oxide layer on surfaces of the slanted structure in the working stamp, wherein the oxide layer includes a metal or semiconductor element that is not in the polymeric layer; and
molding the slanted grating in a resin layer on a substrate using the working stamp that includes the oxide layer.

17. The method of claim 16, further comprising depositing an anti-sticking layer on the oxide layer.

18. The method of claim 16, wherein the oxide layer includes $SiO_2$, $Al_2O_3$, $TiO_2$, $HfO_2$, $ZrO$, $ZnO_2$, or $Si_3N_4$.

19. The method of claim 16, wherein the oxide layer is characterized by a thickness between 0.1 nm and 50 nm.

20. The method of claim 16, wherein depositing the oxide layer on the surfaces of the slanted structure in the working stamp includes depositing the oxide layer conformally on the surfaces of the slanted structure using atomic layer deposition.

* * * * *